(12) United States Patent
Wu et al.

(10) Patent No.: US 9,935,190 B2
(45) Date of Patent: Apr. 3, 2018

(54) FORMING ENHANCEMENT MODE III-NITRIDE DEVICES

(71) Applicant: Transphorm Inc., Goleta, CA (US)

(72) Inventors: Mo Wu, Goleta, CA (US); Rakesh K. Lal, Isla Vista, CA (US); Ilan Ben-Yaacov, Goleta, CA (US); Umesh Mishra, Montecito, CA (US); Carl Joseph Neufeld, Goleta, CA (US)

(73) Assignee: Transphorm Inc., Goleta, CA (US)

( * ) Notice: Subject to any disclaimer, the term of this patent is extended or adjusted under 35 U.S.C. 154(b) by 0 days.

(21) Appl. No.: 15/065,597

(22) Filed: Mar. 9, 2016

(65) Prior Publication Data
US 2016/0190298 A1 Jun. 30, 2016

Related U.S. Application Data

(62) Division of application No. 14/542,937, filed on Nov. 17, 2014, now Pat. No. 9,318,593.
(Continued)

(51) Int. Cl.
*H01L 29/00* (2006.01)
*H01L 29/778* (2006.01)
(Continued)

(52) U.S. Cl.
CPC .... *H01L 29/7787* (2013.01); *H01L 21/28264* (2013.01); *H01L 21/3081* (2013.01);
(Continued)

(58) Field of Classification Search
CPC ......... H01L 21/28264; H01L 21/30621; H01L 21/3081; H01L 21/31144; H01L 29/7787;
(Continued)

(56) References Cited

U.S. PATENT DOCUMENTS

| 4,300,091 A | 11/1981 | Schade, Jr. |
| 4,532,439 A | 7/1985 | Koike |

(Continued)

FOREIGN PATENT DOCUMENTS

| CN | 1596477 | 3/2005 |
| CN | 1748320 | 3/2006 |

(Continued)

OTHER PUBLICATIONS

Authorized officer Chung Keun Lee, International Search Report and Written Opinion in PCT/US2008/076030, dated Mar. 23, 2009, 10 pages.
(Continued)

*Primary Examiner* — Armando Rodriguez
(74) *Attorney, Agent, or Firm* — Fish & Richardson P.C.

(57) ABSTRACT

A method of fabricating a III-N device includes forming a III-N channel layer on a substrate, a III-N barrier layer on the channel layer, an insulator layer on the barrier layer, and a trench in a first portion of the device. Forming the trench comprises removing the insulator layer and a part of the barrier layer in the first portion of the device, such that a remaining portion of the barrier layer in the first portion of the device has a thickness away from a top surface of the channel layer, the thickness being within a predetermined thickness range, annealing the III-N device in a gas ambient including oxygen at an elevated temperature to oxidize the remaining portion of the barrier layer in the first portion of the device, and removing the oxidized remaining portion of the barrier layer in the first portion of the device.

12 Claims, 21 Drawing Sheets

Related U.S. Application Data

(60) Provisional application No. 62/027,126, filed on Jul. 21, 2014.

(51) Int. Cl.
| | |
|---|---|
| *H01L 29/66* | (2006.01) |
| *H01L 29/20* | (2006.01) |
| *H01L 21/28* | (2006.01) |
| *H01L 29/205* | (2006.01) |
| *H01L 29/51* | (2006.01) |
| *H01L 21/306* | (2006.01) |
| *H01L 21/308* | (2006.01) |
| *H01L 21/311* | (2006.01) |
| H01L 29/423 | (2006.01) |
| H01L 29/10 | (2006.01) |
| H01L 21/02 | (2006.01) |

(52) U.S. Cl.
CPC .. *H01L 21/30617* (2013.01); *H01L 21/30621* (2013.01); *H01L 21/31144* (2013.01); *H01L 29/2003* (2013.01); *H01L 29/205* (2013.01); *H01L 29/4236* (2013.01); *H01L 29/517* (2013.01); *H01L 29/518* (2013.01); *H01L 29/66462* (2013.01); *H01L 29/7783* (2013.01); *H01L 29/7786* (2013.01); *H01L 21/02241* (2013.01); *H01L 21/02255* (2013.01); *H01L 29/1066* (2013.01); *H01L 29/4232* (2013.01)

(58) Field of Classification Search
CPC ............... H01L 29/2003; H01L 29/205; H01L 29/4236; H01L 29/517; H01L 29/518; H01L 29/66462; H01L 29/7783; H01L 29/7786

See application file for complete search history.

(56) References Cited

U.S. PATENT DOCUMENTS

| | | | |
|---|---|---|---|
| 4,645,562 A | 2/1987 | Liao et al. |
| 4,665,508 A | 5/1987 | Chang |
| 4,728,826 A | 3/1988 | Einzinger et al. |
| 4,821,093 A | 4/1989 | Iafrate et al. |
| 4,914,489 A | 4/1990 | Awano |
| 5,051,618 A | 9/1991 | Lou |
| 5,329,147 A | 7/1994 | Vo et al. |
| 5,618,384 A | 4/1997 | Chan et al. |
| 5,646,069 A | 7/1997 | Jelloian et al. |
| 5,663,091 A | 9/1997 | Yen et al. |
| 5,705,847 A | 1/1998 | Kashiwa et al. |
| 5,714,393 A | 2/1998 | Wild et al. |
| 5,909,103 A | 6/1999 | Williams |
| 5,998,810 A | 12/1999 | Hatano et al. |
| 6,008,684 A | 12/1999 | Ker et al. |
| 6,097,046 A | 8/2000 | Plumton |
| 6,100,571 A | 8/2000 | Mizuta et al. |
| 6,292,500 B1 | 9/2001 | Kouchi et al. |
| 6,307,220 B1 | 10/2001 | Yamazaki |
| 6,316,793 B1 | 11/2001 | Sheppard et al. |
| 6,373,082 B1 | 4/2002 | Ohno et al. |
| 6,429,468 B1 | 8/2002 | Hsu et al. |
| 6,475,889 B1 | 11/2002 | Ring |
| 6,486,502 B1 | 11/2002 | Sheppard et al. |
| 6,504,235 B2 | 1/2003 | Schmitz et al. |
| 6,515,303 B2 | 2/2003 | Ring |
| 6,548,333 B2 | 4/2003 | Smith |
| 6,552,373 B2 | 4/2003 | Ando et al. |
| 6,580,101 B2 | 6/2003 | Yoshida |
| 6,583,454 B2 | 6/2003 | Sheppard et al. |
| 6,586,781 B2 | 7/2003 | Wu et al. |
| 6,624,452 B2 | 9/2003 | Yu et al. |
| 6,633,195 B2 | 10/2003 | Baudelot et al. |
| 6,649,497 B2 | 11/2003 | Ring |
| 6,727,531 B1 | 4/2004 | Redwing et al. |
| 6,746,938 B2 | 6/2004 | Uchiyama et al. |
| 6,777,278 B2 | 8/2004 | Smith |
| 6,849,882 B2 | 2/2005 | Chavarkar et al. |
| 6,867,078 B1 | 3/2005 | Green et al. |
| 6,914,273 B2 | 7/2005 | Ren et al. |
| 6,946,739 B2 | 9/2005 | Ring |
| 6,979,863 B2 | 12/2005 | Ryu |
| 6,982,204 B2 | 1/2006 | Saxler et al. |
| 7,030,428 B2 | 4/2006 | Saxler |
| 7,038,252 B2 | 5/2006 | Saito et al. |
| 7,045,404 B2 | 5/2006 | Sheppard et al. |
| 7,053,413 B2 | 5/2006 | D'Evelyn et al. |
| 7,071,498 B2 | 7/2006 | Johnson et al. |
| 7,078,743 B2 | 7/2006 | Murata et al. |
| 7,084,475 B2 | 8/2006 | Shelton et al. |
| 7,109,552 B2 | 9/2006 | Wu |
| 7,125,786 B2 | 10/2006 | Ring et al. |
| 7,126,212 B2 | 10/2006 | Enquist et al. |
| 7,161,194 B2 | 1/2007 | Parikh et al. |
| 7,169,634 B2 | 1/2007 | Zhao et al. |
| 7,170,111 B2 | 1/2007 | Saxler |
| 7,199,640 B2 | 4/2007 | De Cremoux et al. |
| 7,217,960 B2 | 5/2007 | Ueno et al. |
| 7,230,284 B2 | 6/2007 | Parikh et al. |
| 7,238,560 B2 | 7/2007 | Sheppard et al. |
| 7,250,641 B2 | 7/2007 | Saito et al. |
| 7,253,454 B2 | 8/2007 | Saxler |
| 7,265,399 B2 | 9/2007 | Sriram et al. |
| 7,268,375 B2 | 9/2007 | Shur et al. |
| 7,304,331 B2 | 12/2007 | Saito et al. |
| 7,321,132 B2 | 1/2008 | Robinson et al. |
| 7,326,971 B2 | 2/2008 | Harris et al. |
| 7,332,795 B2 | 2/2008 | Smith et al. |
| 7,364,988 B2 | 4/2008 | Harris et al. |
| 7,375,407 B2 | 5/2008 | Yanagihara et al. |
| 7,382,001 B2 | 6/2008 | Beach |
| 7,388,236 B2 | 6/2008 | Wu et al. |
| 7,419,892 B2 | 9/2008 | Sheppard et al. |
| 7,429,534 B2 | 9/2008 | Gaska et al. |
| 7,432,142 B2 | 10/2008 | Saxler et al. |
| 7,436,001 B2 | 10/2008 | Lee et al. |
| 7,449,730 B2 | 11/2008 | Kuraguchi |
| 7,456,443 B2 | 11/2008 | Saxler et al. |
| 7,465,967 B2 | 12/2008 | Smith et al. |
| 7,465,997 B2 | 12/2008 | Kinzer et al. |
| 7,482,788 B2 | 1/2009 | Yang |
| 7,488,992 B2 | 2/2009 | Robinson |
| 7,501,669 B2 | 3/2009 | Parikh et al. |
| 7,501,670 B2 | 3/2009 | Murphy |
| 7,508,014 B2 | 3/2009 | Tanimoto |
| 7,544,963 B2 | 6/2009 | Saxler |
| 7,547,925 B2 | 6/2009 | Wong et al. |
| 7,548,112 B2 | 6/2009 | Sheppard |
| 7,550,781 B2 | 6/2009 | Kinzer et al. |
| 7,550,783 B2 | 6/2009 | Wu et al. |
| 7,550,784 B2 | 6/2009 | Saxler et al. |
| 7,566,580 B2 | 7/2009 | Keller et al. |
| 7,566,918 B2 | 7/2009 | Wu et al. |
| 7,573,078 B2 | 8/2009 | Wu et al. |
| 7,592,211 B2 | 9/2009 | Sheppard et al. |
| 7,598,108 B2 | 10/2009 | Li et al. |
| 7,601,993 B2 | 10/2009 | Hoshi et al. |
| 7,605,017 B2 | 10/2009 | Hayashi et al. |
| 7,612,363 B2 | 11/2009 | Takeda et al. |
| 7,612,390 B2 | 11/2009 | Saxler et al. |
| 7,615,774 B2 | 11/2009 | Saxler |
| 7,629,627 B2 | 12/2009 | Mil'shtein et al. |
| 7,638,818 B2 | 12/2009 | Wu et al. |
| 7,655,962 B2 | 2/2010 | Simin et al. |
| 7,678,628 B2 | 3/2010 | Sheppard et al. |
| 7,692,263 B2 | 4/2010 | Wu et al. |
| 7,700,973 B2 | 4/2010 | Shen et al. |
| 7,709,269 B2 | 5/2010 | Smith et al. |
| 7,709,859 B2 | 5/2010 | Smith et al. |
| 7,714,360 B2 | 5/2010 | Otsuka et al. |
| 7,723,739 B2 | 5/2010 | Takano et al. |
| 7,728,356 B2 | 6/2010 | Suh et al. |
| 7,745,851 B2 | 6/2010 | Harris |

(56) References Cited

U.S. PATENT DOCUMENTS

| | | |
|---|---|---|
| 7,755,108 B2 | 7/2010 | Kuraguchi |
| 7,759,699 B2 | 7/2010 | Beach |
| 7,759,700 B2 | 7/2010 | Ueno et al. |
| 7,777,252 B2 | 8/2010 | Sugimoto et al. |
| 7,777,254 B2 | 8/2010 | Sato |
| 7,795,622 B2 | 9/2010 | Kikkawa et al. |
| 7,795,642 B2 | 9/2010 | Suh et al. |
| 7,811,872 B2 | 10/2010 | Hoshi et al. |
| 7,812,369 B2 | 10/2010 | Chini et al. |
| 7,834,380 B2 | 11/2010 | Ueda et al. |
| 7,851,825 B2 | 12/2010 | Suh et al. |
| 7,855,401 B2 | 12/2010 | Sheppard et al. |
| 7,859,014 B2 | 12/2010 | Nakayama et al. |
| 7,859,020 B2 | 12/2010 | Kikkawa et al. |
| 7,859,021 B2 | 12/2010 | Kaneko |
| 7,875,537 B2 | 1/2011 | Suvorov et al. |
| 7,875,907 B2 | 1/2011 | Honea et al. |
| 7,875,910 B2 | 1/2011 | Sheppard et al. |
| 7,875,914 B2 | 1/2011 | Sheppard |
| 7,884,394 B2 | 2/2011 | Wu et al. |
| 7,884,395 B2 | 2/2011 | Saito |
| 7,892,974 B2 | 2/2011 | Ring et al. |
| 7,893,424 B2 | 2/2011 | Eichler et al. |
| 7,893,500 B2 | 2/2011 | Wu et al. |
| 7,898,004 B2 | 3/2011 | Wu et al. |
| 7,901,994 B2 | 3/2011 | Saxler et al. |
| 7,906,799 B2 | 3/2011 | Sheppard et al. |
| 7,915,643 B2 | 3/2011 | Suh et al. |
| 7,915,644 B2 | 3/2011 | Wu et al. |
| 7,919,791 B2 | 4/2011 | Flynn et al. |
| 7,928,475 B2 | 4/2011 | Parikh et al. |
| 7,932,539 B2 | 4/2011 | Chen et al. |
| 7,935,985 B2 | 5/2011 | Mishra et al. |
| 7,939,391 B2 | 5/2011 | Suh et al. |
| 7,948,011 B2 | 5/2011 | Rajan et al. |
| 7,955,918 B2 | 6/2011 | Wu et al. |
| 7,955,984 B2 | 6/2011 | Ohki |
| 7,956,383 B2 | 6/2011 | Kuroda et al. |
| 7,960,756 B2 | 6/2011 | Sheppard et al. |
| 7,961,482 B2 | 6/2011 | Ribarich |
| 7,965,126 B2 | 6/2011 | Honea et al. |
| 7,973,335 B2 | 7/2011 | Okamoto et al. |
| 7,982,242 B2 | 7/2011 | Goto |
| 7,985,986 B2 | 7/2011 | Heikman et al. |
| 7,985,987 B2 | 7/2011 | Kaneko |
| 8,039,352 B2 | 10/2011 | Mishra et al. |
| 8,044,380 B2 | 10/2011 | Lee |
| 8,049,252 B2 | 11/2011 | Smith et al. |
| 8,076,698 B2 | 12/2011 | Ueda et al. |
| 8,076,699 B2 | 12/2011 | Chen et al. |
| 8,093,606 B2 | 1/2012 | Sonobe et al. |
| 8,110,425 B2 | 2/2012 | Yun |
| 8,114,717 B2 | 2/2012 | Palacios et al. |
| 8,153,515 B2 | 4/2012 | Saxler |
| 8,174,048 B2 | 5/2012 | Beach |
| 8,178,900 B2 | 5/2012 | Kurachi et al. |
| 8,223,458 B2 | 7/2012 | Mochizuki et al. |
| 8,237,196 B2 | 8/2012 | Saito |
| 8,237,198 B2 | 8/2012 | Wu et al. |
| 8,264,003 B2 | 9/2012 | Herman |
| 8,361,816 B2 | 1/2013 | Lee et al. |
| 8,363,437 B2 | 1/2013 | Wang et al. |
| 8,389,975 B2 | 3/2013 | Kikuchi et al. |
| 8,389,977 B2 | 3/2013 | Chu et al. |
| 8,390,000 B2 | 3/2013 | Chu et al. |
| 8,404,042 B2 | 3/2013 | Mizuhara et al. |
| 8,431,960 B2 | 4/2013 | Beach et al. |
| 8,455,885 B2 | 6/2013 | Keller et al. |
| 8,471,267 B2 | 6/2013 | Hayashi et al. |
| 8,476,125 B2 | 7/2013 | Khan et al. |
| 8,492,779 B2 | 7/2013 | Lee |
| 8,502,323 B2 | 8/2013 | Chen |
| 8,519,438 B2 | 8/2013 | Mishra et al. |
| 8,525,231 B2 | 9/2013 | Park et al. |
| 8,530,904 B2 | 9/2013 | Treu et al. |
| 8,598,937 B2 | 12/2013 | Lal et al. |
| 8,603,880 B2 | 12/2013 | Yamada |
| 8,614,460 B2 | 12/2013 | Matsushita |
| 8,652,948 B2 | 2/2014 | Horie et al. |
| 8,674,407 B2 | 3/2014 | Ando et al. |
| 8,698,198 B2 | 4/2014 | Kuraguchi |
| 8,716,141 B2 | 5/2014 | Dora et al. |
| 8,742,460 B2 | 6/2014 | Mishra et al. |
| 8,772,832 B2 | 7/2014 | Boutros |
| 8,785,305 B2 | 7/2014 | Ramdani |
| 8,803,246 B2 | 8/2014 | Wu et al. |
| 2003/0006437 A1 | 1/2003 | Mizuta et al. |
| 2003/0030056 A1 | 2/2003 | Callaway, Jr. |
| 2004/0119067 A1 | 6/2004 | Weeks, Jr. et al. |
| 2005/0133816 A1 | 6/2005 | Fan et al. |
| 2005/0189559 A1 | 9/2005 | Saito et al. |
| 2006/0076677 A1 | 4/2006 | Daubenspeck et al. |
| 2006/0145189 A1 | 7/2006 | Beach |
| 2006/0189109 A1 | 8/2006 | Fitzgerald |
| 2006/0202272 A1 | 9/2006 | Wu et al. |
| 2006/0226442 A1 | 10/2006 | Zhang et al. |
| 2007/0018199 A1 | 1/2007 | Sheppard et al. |
| 2007/0045670 A1 | 3/2007 | Kuraguchi |
| 2007/0128743 A1 | 6/2007 | Huang et al. |
| 2007/0131968 A1 | 6/2007 | Morita et al. |
| 2007/0145417 A1 | 6/2007 | Brar et al. |
| 2007/0205433 A1 | 9/2007 | Parikh et al. |
| 2007/0210329 A1 | 9/2007 | Goto |
| 2007/0228477 A1 | 10/2007 | Suzuki et al. |
| 2007/0249119 A1 | 10/2007 | Saito |
| 2007/0295985 A1 | 12/2007 | Weeks, Jr. et al. |
| 2008/0073670 A1 | 3/2008 | Yang et al. |
| 2008/0272397 A1 | 11/2008 | Koudymov et al. |
| 2008/0308813 A1 | 12/2008 | Suh et al. |
| 2009/0045438 A1 | 2/2009 | Inoue et al. |
| 2009/0050936 A1 | 2/2009 | Oka |
| 2009/0072269 A1 | 3/2009 | Suh et al. |
| 2009/0075455 A1 | 3/2009 | Mishra |
| 2009/0085065 A1 | 4/2009 | Mishra et al. |
| 2009/0140262 A1 | 6/2009 | Ohki et al. |
| 2010/0044752 A1 | 2/2010 | Marui |
| 2010/0065923 A1 | 3/2010 | Charles et al. |
| 2010/0133506 A1 | 6/2010 | Nakanishi et al. |
| 2010/0203234 A1 | 8/2010 | Anderson et al. |
| 2010/0219445 A1 | 9/2010 | Yokoyama et al. |
| 2011/0012110 A1 | 1/2011 | Sazawa et al. |
| 2011/0127604 A1 | 6/2011 | Sato |
| 2012/0217512 A1 | 8/2012 | Renaud |
| 2012/0235160 A1* | 9/2012 | Heikman ............ H01L 29/7787 257/76 |
| 2012/0267637 A1 | 10/2012 | Jeon et al. |
| 2013/0056744 A1 | 3/2013 | Mishra et al. |
| 2013/0292698 A1 | 11/2013 | Then et al. |
| 2013/0313561 A1 | 11/2013 | Suh |
| 2013/0328061 A1 | 12/2013 | Chu et al. |
| 2014/0084346 A1 | 3/2014 | Tajiri |
| 2014/0099757 A1 | 4/2014 | Parikh et al. |
| 2014/0264370 A1 | 9/2014 | Keller et al. |
| 2014/0264455 A1 | 9/2014 | Keller et al. |
| 2016/0020313 A1 | 1/2016 | Wu et al. |

FOREIGN PATENT DOCUMENTS

| | | |
|---|---|---|
| CN | 101107713 | 1/2008 |
| CN | 101312207 | 11/2008 |
| CN | 101897029 | 11/2010 |
| CN | 102017160 | 4/2011 |
| CN | 103477543 | 12/2013 |
| CN | 103493206 | 1/2014 |
| EP | 1 998 376 | 12/2008 |
| EP | 2 188 842 | 5/2010 |
| JP | 09-306926 | 11/1997 |
| JP | 11-224950 | 8/1999 |
| JP | 2000-058871 | 2/2000 |
| JP | 2003-229566 | 8/2003 |
| JP | 2003-244943 | 8/2003 |
| JP | 2004-253620 | 9/2004 |
| JP | 2004-260114 | 9/2004 |
| JP | 2006-032749 | 2/2006 |

(56) References Cited

FOREIGN PATENT DOCUMENTS

| | | |
|---|---|---|
| JP | 2006-033723 | 2/2006 |
| JP | 2007-036218 | 2/2007 |
| JP | 2007-505501 | 3/2007 |
| JP | 2007-215331 | 8/2007 |
| JP | 2008-091699 | 4/2008 |
| JP | 2008-199771 | 8/2008 |
| JP | 2008-243848 | 10/2008 |
| JP | 2009-503815 | 1/2009 |
| JP | 2009-054807 | * 3/2009 |
| JP | 2009-524242 | 6/2009 |
| JP | 2010-087076 | 4/2010 |
| JP | 2010-525023 | 7/2010 |
| JP | 2010-539712 | 12/2010 |
| KR | 2011-0033584 | 3/2011 |
| TW | 200924068 | 6/2009 |
| TW | 200924201 | 6/2009 |
| TW | 200947703 | 11/2009 |
| TW | 201010076 | 3/2010 |
| TW | 201027759 | 7/2010 |
| TW | 201027912 | 7/2010 |
| TW | 201036155 | 10/2010 |
| TW | 201322443 | 6/2013 |
| WO | WO 2004/070791 | 8/2004 |
| WO | WO 2004/098060 | 11/2004 |
| WO | WO 2005/036749 | 4/2005 |
| WO | WO 2005/070007 | 8/2005 |
| WO | WO 2005/070009 | 8/2005 |
| WO | WO 2006/114883 | 11/2006 |
| WO | WO 2007/077666 | 7/2007 |
| WO | WO 2007/108404 | 9/2007 |
| WO | WO 2008/120094 | 10/2008 |
| WO | WO 2009/036181 | 3/2009 |
| WO | WO 2009/036266 | 3/2009 |
| WO | WO 2009/039028 | 3/2009 |
| WO | WO 2009/039041 | 3/2009 |
| WO | WO 2009/076076 | 6/2009 |
| WO | WO 2009/132039 | 10/2009 |
| WO | WO 2010/039463 | 4/2010 |
| WO | WO 2010/068554 | 6/2010 |
| WO | WO 2010/090885 | 8/2010 |
| WO | WO 2010/132587 | 11/2010 |
| WO | WO 2011/031431 | 3/2011 |
| WO | WO 2011/072027 | 6/2011 |
| WO | WO 2013/052833 | 4/2013 |

OTHER PUBLICATIONS

Authorized officer Yolaine Cussac, International Preliminary Report on Patentability in PCT/US2008/076030, dated Mar. 25, 2010, 5 pages.
Authorized officer Chung Keun Lee, International Search Report and Written Opinion in PCT/US2008/076079, dated Mar. 20, 2009, 11 pages.
Authorized officer Nora Lindner, International Preliminary Report on Patentability in PCT/US2008/076079, dated Apr. 1, 2010, 6 pages.
Authorized officer Keon Hyeong Kim, International Search Report and Written Opinion in PCT/US2008/076160 dated Mar. 18, 2009, 11 pages.
Authorized officer Simin Baharlou, International Preliminary Report on Patentability in PCT/US2008/076160, dated Mar. 25, 2010, 6 pages.
Authorized officer Chung Keun Lee, International Search Report and Written Opinion in PCT/US2008/076199, dated Mar. 24, 2009, 11 pages.
Authorized officer Dorothée Mülhausen, International Preliminary Report on Patentability in PCT/US2008/076199, dated Apr. 1, 2010, 6 pages.
Authorized officer Keon Hyeong Kim, International Search Report and Written Opinion in PCT/US2008/085031, dated Jun. 24, 2009, 11 pages.
Authorized officer Yolaine Cussac, International Preliminary Report on Patentability in PCT/US2008/085031, dated Jun. 24, 2010, 6 pages.
Authorized officer Tae Hoon Kim, International Search Report and Written Opinion in PCT/US2009/041304, dated Dec. 18, 2009, 13 pages.
Authorized officer Dorothée Mülhausen, International Preliminary Report on Patentability, in PCT/US2009/041304, dated Nov. 4, 2010, 8 pages.
Authorized officer Sung Hee Kim, International Search Report and the Written Opinion in PCT/US2009/057554, dated May 10, 2010, 13 pages.
Authorized Officer Gijsbertus Beijer, International Preliminary Report on Patentability in PCT/US2009/057554, dated Mar. 29, 2011, 7 pages.
Authorized officer Cheon Whan Cho, International Search Report and Written Opinion in PCT/US2009/066647, dated Jul. 1, 2010, 16 pages.
Authorized officer Athina Nikitas-Etienne, International Preliminary Report on Patentability in PCT/US2009/066647, dated Jun. 23, 2011, 12 pages.
Authorized officer Sung Chan Chung, International Search Report and Written Opinion for PCT/US2010/021824, dated Aug. 23, 2010, 9 pages.
Authorized officer Beate Giffo-Schmitt, International Preliminary Report on Patentability in PCT/US2010/021824, dated Aug. 18, 2011, 6 pages.
Authorized officer Sang Ho Lee, International Search Report and Written Opinion in PCT/US2010/034579, dated Dec. 24, 2010, 9 pages.
Authorized officer Nora Lindner, International Preliminary Report on Patentability in PCT/US2010/034579, dated Nov. 24, 2011, 7 pages.
Authorized officer Jeongmin Choi, International Search Report and Written Opinion in PCT/US2010/046193, dated Apr. 26, 2011, 13 pages.
Authorized officer Philippe Bécamel, International Preliminary Report on Patentability in PCT/US2010/046193, dated Mar. 8, 2012, 10 pages.
Authorized officer Sang Ho Lee, International Search Report and Written Opinion in PCT/US2010/059486, dated Jul. 26, 2011, 9 pages.
Authorized officer Nora Lindner, International Preliminary Report on Patentability in PCT/US2010/059486, dated Jun. 21, 2012, 6 pages.
Authorized officer Kwan Sik Sul, International Search Report and Written Opinion in PCT/US2011/063975, dated May 18, 2012, 8 pages.
Authorized officer Simin Baharlou, International Preliminary Report on Patentability in PCT/US2011/063975, dated Jun. 27, 2013, 5 pages.
Authorized officer Sang-Taek Kim, International Search Report and Written Opinion in PCT/US2011/061407, dated May 22, 2012, 10 pages.
Authorized officer Lingfei Bai, International Preliminary Report on Patentability in PCT/US2011/061407, dated Jun. 6, 2013, 7 pages.
Authorized officer Kwan Sik Sul, International Search Report and Written Opinion in PCT/US2012/023160, dated May 24, 2012, 9 pages.
Authorized officer Simin Baharlou, International Preliminary Report on Patentability in PCT/US2012/023160, dated Aug. 15, 2013, 6 pages.
Authorized officer Jeongmin Choi, International Search Report and Written Opinion in PCT/US2012/027146, dated Sep. 24, 2012, 12 pages.
Authorized officer Athina Nickitas-Etienne, International Preliminary Report on Patentability in PCT/US2012/027146, dated Sep. 19, 2013, 9 pages.
Authorized officer Tae Hoon Kim, International Search Report and Written Opinion in PCT/US2013/035837, dated Jul. 30, 2013, 9 pages.

(56) References Cited

OTHER PUBLICATIONS

Authorized officer Agnès Wittmann-Regis, International Preliminary Report on Patentability in PCT/US2013/035837, dated Oct. 23, 2014, 6 pages.
Authorized officer Sang Won Choi, International Search Report and Written Opinion in PCT/US2013/048275, dated Oct. 14, 2013, 17 pages.
Authorized officer Simin Baharlou, International Preliminary Report on Patentability in PCT/US2013/048275, dated Jan. 8, 2015, 14 pages.
Authorized officer Hye Lyun Park, International Search Report and Written Opinion in PCT/US2013/050914, dated Oct. 18, 2013, 11 pages.
Authorized officer Yukari Nakamura, International Preliminary Report on Patentability in PCT/US2013/050914, dated Jan. 29, 2015, 8 pages.
Authorized officer Sang Won Choi, International Search Report and Written Opinion in PCT/US2013/024470, dated May 27, 2013, 12 pages.
Authorized officer Simin Baharlou, International Preliminary Report on Patentability in PCT/US2013/024470, dated Aug. 14, 2014, 9 pages.
Authorized officer June Young Son, International Search Report and Written Opinion in PCT/US2014/016298, dated May 23, 2014, 15 pages.
Authorized officer Kihwan Moon, International Preliminary Report on Patentability in PCT/US2014/016298, dated Aug. 27, 2015, 12 pages.
Authorized officer Tae Hoon Kim, International Search Report and Written Opinion in PCT/US2014/027523, dated Jul. 30, 2014, 14 pages.
Authorized officer Nora Lindner, International Preliminary Report on Patentability in PCT/US2014/027523, dated Sep. 24, 2015, 11 pages.
Authorized officer June Young Son, International Search Report and Written Opinion in PCT/US2014/024191, dated Aug. 7, 2014, 11 pages.
Authorized officer Kihwan Moon, International Preliminary Report on Patentability in PCT/US2014/024191, dated Sep. 24, 2015, 8 pages.
Authorized officer June Young Son, International Search Report and Written Opinion in PCT/US2014/046030, dated Oct. 21, 2014, 12 pages.
European Search Report in Application No. 10 81 5813.0, dated Mar. 12, 2013, 9 pages.
Search Report and Action in TW Application No. 098132132, dated Dec. 6, 2012, 8 pages.
Search Report and Action in TW Application No. 098141930, dated Jul. 10, 2014, 7 pages.
Chinese First Office Action for Application No. 200880120050.6, dated Aug. 2, 2011, 10 pages.
Chinese First Office Action for Application No. 200980114639.X, dated May 14, 2012, 13 pages.
Ando et al., "10-W/mm AlGaN—GaN HFET with a Field Modulating Plate," IEEE Electron Device Letters, 2003, 24(5):289-291.
Arulkumaran et al., "Enhancement of Breakdown Voltage by AlN Buffer Layer Thickness in AlGaN/GaN High-electron-mobility Transistors on 4 in. Diameter Silicon," Applied Physics Letters, 2005, 86:123503-1-3.
Arulkumaran et al. "Surface Passivation Effects on AlGaN/GaN High-Electron-Mobility Transistors with $SiO_2$, $Si_3N_4$, and Silicon Oxynitride," Applied Physics Letters, 2004, 84(4):613-615.
Barnett and Shinn, "Plastic and Elastic Properties of Compositionally Modulated Thin Films," Annu. Rev. Mater. Sci., 1994, 24:481-511.
Chen et al., "High-performance AlGaN/GaN Lateral Field-effect Rectifiers Compatible with High Electron Mobility Transistors," Applied Physics Letters, 2008, 92, 253501-1-3.

Cheng et al., "Flat GaN Epitaxial Layers Grown on Si(111) by Metalorganic Vapor Phase Epitaxy Using Step-graded AlGaN Intermediate Layers," Journal of Electronic Materials, 2006, 35(4):592-598.
Coffie, "Characterizing and Suppressing DC-to-RF Dispersion in AlGaN/GaN High Electron Mobility Transistors," 2003, PhD Thesis, University of California, Santa Barbara, 169 pages.
Coffie et al., "Unpassivated p-GaN/AlGaN/GaN HEMTs with 7.1 W/mm at 10 GhZ," Electronic Letters, 2003, 39(19):1419-1420.
Chu et al., "1200-V Normally Off GaN-on-Si Field-effect Transistors with Low Dynamic On-Resistance," IEEE Electron Device Letters, 2011, 32(5):632-634.
Dora et al., "High Breakdown Voltage Achieved on AlGaN/GaN HEMTs with Integrated Slant Field Plates," IEEE Electron Device Letters, 2006, 27(9):713-715.
Dora et al., "$ZrO_2$ Gate Dielectrics Produced by Ultraviolet Ozone Oxidation for GaN and AlGaN/GaN Transistors," J. Vac. Sci. Technol. B, 2006, 24(2)575-581.
Dora, "Understanding Material and Process Limits for High Breakdown Voltage AlGaN/GaN HEMTs," PhD Thesis, University of California, Santa Barbara, Mar. 2006, 157 pages.
Fanciulli et al., "Structural and Electrical Properties of $HfO_2$ Films Grown by Atomic Layer Deposition on Si, Ge, GaAs and GaN," Mat. Res. Soc. Symp. Proc., 2004, vol. 786, 6 pages.
Green et al., "The Effect of Surface Passivation on the Microwave Characteristics of Undoped AlGaN/GaN HEMT's," IEEE Electron Device Letters, 2000, 21(6):268 270.
Gu et al., "AlGaN/GaN MOS Transistors using Crystalline $ZrO_2$ as Gate Dielectric," Proceedings of SPIE, 2007, vol. 6473, 64730S-1-8.
Higashiwaki et al. "AlGaN/GaN Heterostructure Field-Effect Transistors on 4H—SiC Substrates with Current-Gain Cutoff Frequency of 190 GHz," Applied Physics Express, 2008, 021103-1-3.
Hwang et al., "Effects of a Molecular Beam Epitaxy Grown AlN Passivation Layer on AlGaN/GaN Heterojunction Field Effect Transistors," Solid-State Electronics, 2004, 48:363-366.
Im et al., "Normally Off GaN MOSFET Based on AlGaN/GaN Heterostructure with Extremely High 2DEG Density Grown on Silicon Substrate," IEEE Electron Device Letters, 2010, 31(3):192-194.
Karmalkar and Mishra, "Enhancement of Breakdown Voltage in AlGaN/GaN High Electron Mobility Transistors Using a Field Plate," IEEE Transactions on Electron Devices, 2001, 48(8):1515-1521.
Karmalkar and Mishra, "Very High Voltage AlGaN/GaN High Electron Mobility Transistors Using a Field Plate Deposited on a Stepped Insulator," Solid-State Electronics, 2001, 45:1645-1652.
Keller et al., "GaN-GaN Junctions with Ultrathin AlN Interlayers: Expanding Heterojunction Design," Applied Physics Letters, 2002, 80(23):4387-4389.
Khan et al., "AlGaN/GaN Metal Oxide Semiconductor Heterostructure Field Effect Transistor," IEEE Electron Device Letters, 2000, 21(2):63-65.
Kim, "Process Development and Device Characteristics of AlGaN/GaN HEMTs for High Frequency Applications," PhD Thesis, University of Illinois at Urbana-Champaign, 2007, 120 pages.
Kumar et al., "High Transconductance Enhancement-mode AlGaN/GaN HEMTs on SiC Substrate," Electronics Letters, 2003, 39(24):1758-1760.
Kuraguchi et al., "Normally-off GaN-MISFET with Well-controlled Threshold Voltage," Phys. Stats. Sol., 2007, 204(6):2010-2013.
Lanford et al., "Recessed-gate Enhancement-mode GaN HEMT with High Threshold Voltage," Electronic Letters, 2005, 41(7):449-450.
Lee et al., "Self-aligned Process for Emitter- and Base-regrowth GaN HBTs and BJTs," Solid-State Electronics, 2001, 45:243-247.
Marchand et al., "Metalorganic Chemical Vapor Deposition on GaN on Si(111): Stress Control and Application to Filed-effect Transistors," Journal of Applied Physics, 2001, 89(12):7846-7851.
Mishra et al., "AlGaN/GaN HEMTs—An Overview of Device Operation and Applications," Proceedings of the IEEE, 2002, 90(6):1022-1031.

(56) References Cited

OTHER PUBLICATIONS

Nanjo et al., "Remarkable Breakdown Voltage Enhancement in AlGaN Channel High Electron Mobility Transistors," Applied Physics Letters 92 (2008), 3 pages.
Napierala et al., "Selective GaN Epitaxy on Si(111) Substrates Using Porous Aluminum Oxide Buffer Layers," Journal of the Electrochemical Society, 2006. 153(2):G125-G127, 4 pages.
Oka and Nozawa, "AlGaN/GaN Recessed MIS-gate HFET with High-threshold-voltage Normally-off Operation for Power Electronics Applications," IEEE Electron Device Letters, 2008, 29(7):668-670.
Palacios et al., "AlGaN/GaN HEMTs with an InGaN-based Back-barrier," Device Research Conference Digest, 2005, DRC '05 63rd, pp. 181-182.
Palacios et al., "AlGaN/GaN High Electron Mobility Transistors with InGaN Back-Barriers," IEEE Electron Device Letters, 2006, 27(1):13-15.
Palacios et al., "Nitride-based High Electron Mobility Transistors with a GaN Spacer," Applied Physics Letters, 2006, 89:073508-1-3.
Pei et al., "Effect of Dielectric Thickness on Power Performance of AlGaN/GaN HEMTs," IEEE Electron Device Letters, 2009, 30(4):313-315.
Tracy Frost, "Planar, Low Switching Loss, Gallium Nitride Devices for Power Conversion Applications," SBIR N121-090 (Navy), 2012, 3 pages.
Rajan et al., "Advanced Transistor Structures Based on N-face GaN," 32M International Symposium on Compound Semiconductors (ISCS), Sep. 18-22, 2005, Europa-Park Rust, Germany, 2 pages.
Reiher et al., "Efficient Stress Relief in GaN Heteroepitaxy on Si(111) Using Low-temperature AlN Interlayers," Journal of Crystal Growth, 2003, 248:563-567.
Saito et al., "Recessed-gate Structure Approach Toward Normally Off High-voltage AlGaN/GaN HEMT for Power Electronics Applications," IEEE Transactions on Electron Device, 2006, 53(2):356-362.
Shelton et al., "Selective Area Growth and Characterization of AlGaN/GaN Heterojunction Bipolar Transistors by Metalorganic Chemical Vapor Deposition," IEEE Transactions on Electron Devices, 2001, 48(3):490-494.
Shen, "Advanced Polarization-based Design of AlGaN/GaN HEMTs," Jun. 2004, PhD Thesis, University of California, Santa Barbara, 192 pages.

Sugiura et al., "Enhancement-mode n-channel GaN MOSFETs Fabricated on p-GaN Using $HfO_2$ as Gate Oxide," Electronics Letters, 2007, vol. 43, No. 17, 2 pages.
Suh et al. "High-Breakdown Enhancement-mode AlGaN/GaN HEMTs with Integrated Slant Field-Plate," Electron Devices Meeting, 2006, IEDM '06 International, 3 pages.
Tipirneni et al. "Silicon Dioxide-encapsulated High-Voltage AlGaN/GaN HFETs for Power-Switching Applications," IEEE Electron Device Letters, 2007, 28(9):784-786.
Vetury et al., "Direct Measurement of Gate Depletion in High Breakdown (405V) Al/GaN/GaN Heterostructure Field Effect Transistors," IEDM 98, 1998, pp. 55-58.
Wang et al., "Comparison of the Effect of Gate Dielectric Layer on 2DEG Carrier Concentration in Strained AlGaN/GaN Heterostructure," Mater. Res. Soc. Symp. Proc., 2007, vol. 831, 6 pages.
Wang et al "Enhancement-mode $Si_3N_4$/AlGaN/GaN MISHFETs," IEEE Electron Device Letters, 2006, 27(10):793-795.
Wu, "AlGaN/GaN Microwave Power High-Mobility Transistors," PhD Thesis, University of California, Santa Barbara, Jul. 1997, 134 pages.
Wu et al., "A 97.8% Efficient GaN HEMT Boost Converter with 300-W Output Power at 1 MHz," Electronic Device Letters, 2008, IEEE, 29(8):824-826.
Yoshida, "AlGan/GaN Power FET," Furukawa Review, 2002, 21:7-11.
Zhang, "High Voltage GaN HEMTs with Low On-resistance for Switching Applications," PhD Thesis, University of California, Santa Barbara, Sep. 2002, 166 pages.
Zhanghong Content, Shanghai Institute of Metallurgy, Chinese Academy of Sciences, "Two-Dimensional Electron Gas and High Electron Mobility Transistor (HEMT)," Dec. 31, 1984, 17 pages.
Authorized officer Agnès Wittmann-Regis, International Preliminary Report on Patentability in PCT/US2014/046030, dated Jan. 28, 2016, 9 pages.
Authorized officer Kihwan Moon, International Preliminary Report on Patentability in PCT/US2015/041199, dated Feb. 2, 2017, 12 pages.
Authorized officer Sang Won Choi, International Search Report and Written Opinion in PCT/US2015/041199, dated Apr. 5, 2016, 15 pages.

\* cited by examiner

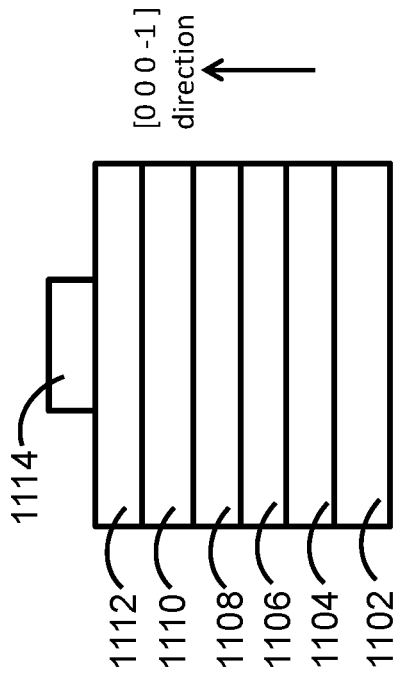
FIG. 11A
FIG. 11B
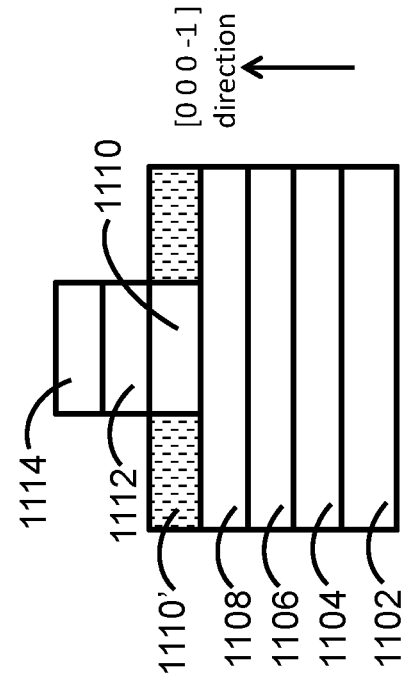
FIG. 11C
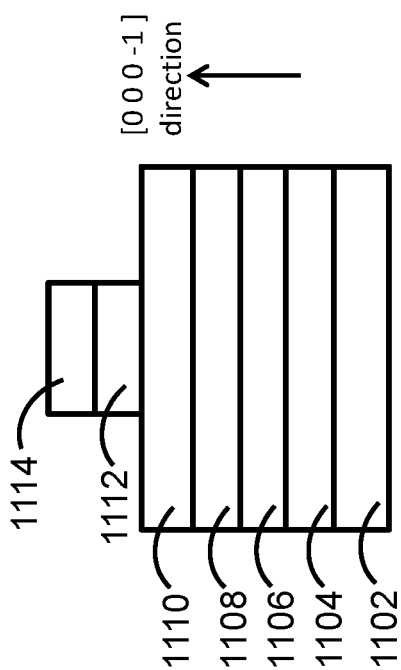
FIG. 11D

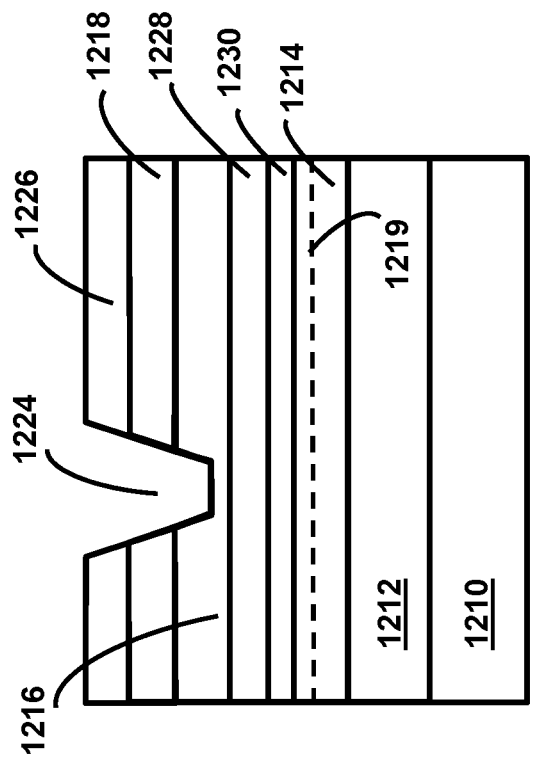
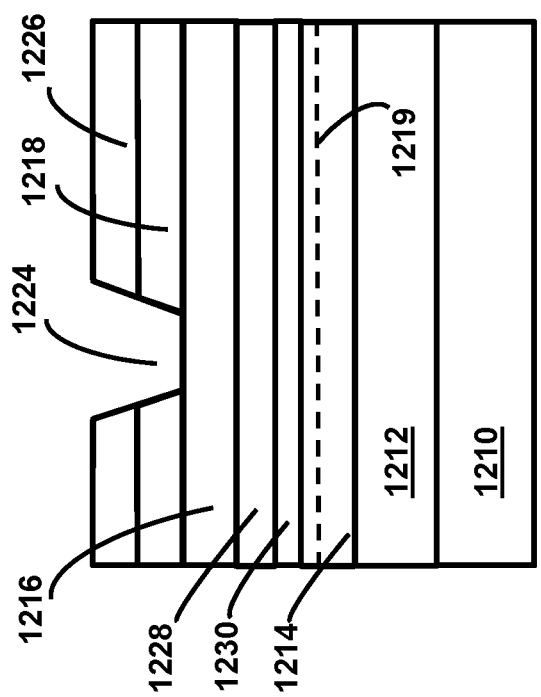

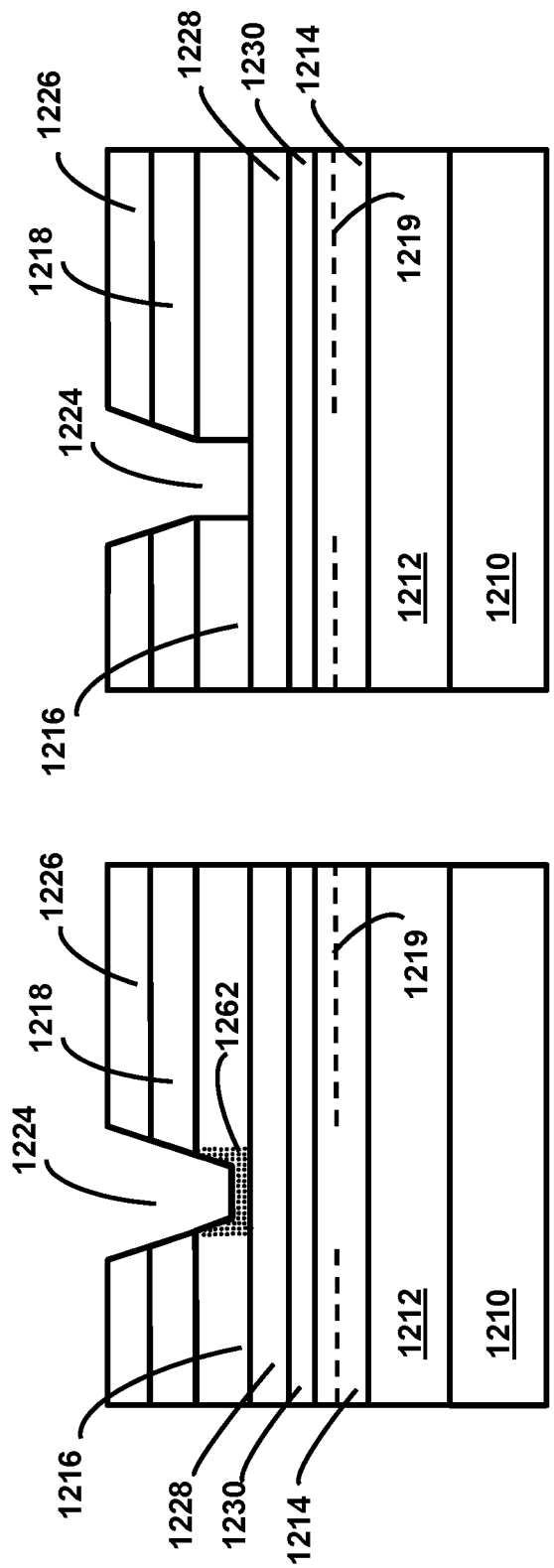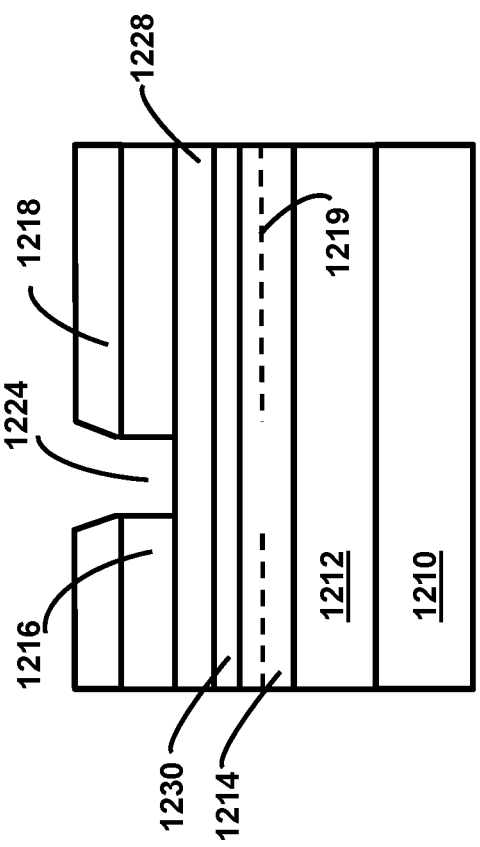

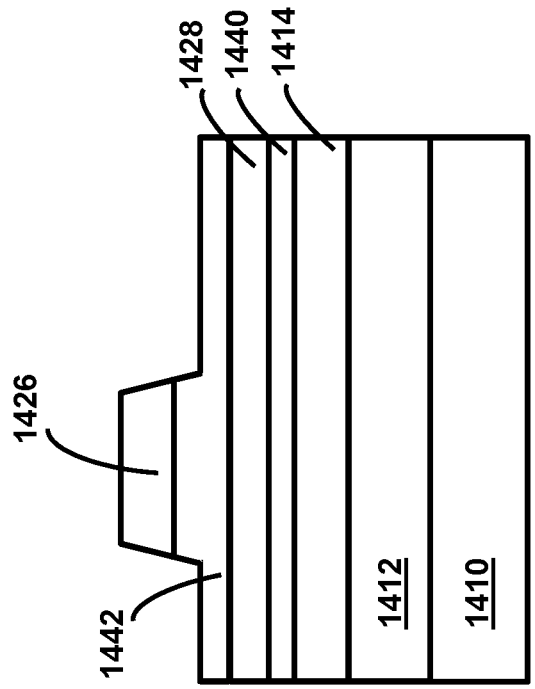
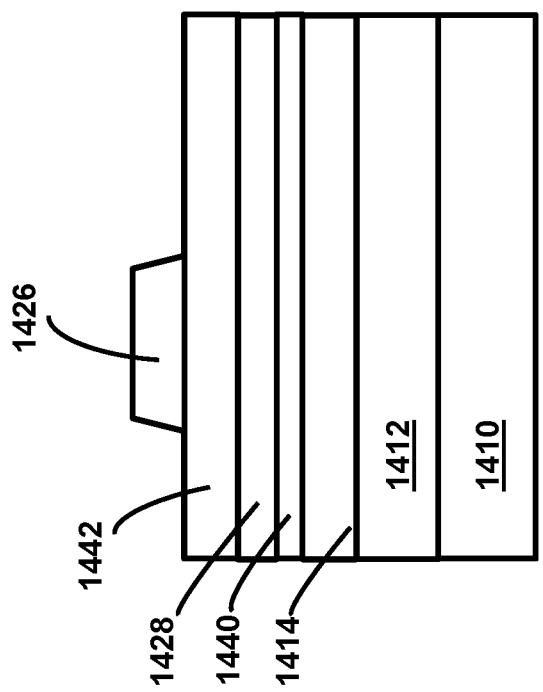

US 9,935,190 B2

FORMING ENHANCEMENT MODE III-NITRIDE DEVICES

CROSS-REFERENCE TO RELATED APPLICATIONS

This is a divisional of U.S. application Ser. No. 14/542,937, filed on Nov. 17, 2014, which claims priority to U.S. Provisional Application No. 62/027,126, filed on Jul. 21, 2014. The disclosures of the prior applications are considered part of and are incorporated by reference in the disclosure of this application.

STATEMENT REGARDING FEDERALLY SPONSORED RESEARCH OR DEVELOPMENT

This invention was made with Government support awarded by ARPA-E [Award #DE-AR0000212]. The Government has certain tights in this invention, including the right to revoke or modify the license to manufacture if the recipient is unable to expeditiously realize practical applications.

TECHNICAL FIELD

This specification relates to semiconductor electronic devices, specifically III-Nitride (III-N) semiconductor devices.

BACKGROUND

Most power semiconductor devices, e.g., high-voltage P-I-N diodes, and power transistors, e.g., power metal-oxide-semiconductor field-effect transistors (MOSFETs) and Insulated Gate Bipolar Transistors (IGBTs), have been typically fabricated with silicon (Si) semiconductor materials. Silicon carbide (SiC) power devices have also been used. III-N devices are attractive semiconductor devices to carry large currents and support high voltages, and provide very low on resistance, high voltage operation, and fast switching times.

Some III-N devices, e.g., high electron mobility transistors (HEMTs) and bidirectional switches (also known as four quadrant switches or FQSs), may be depletion-mode (or D-mode) or normally-on devices, e.g., devices with a negative threshold voltage. That is, the devices are in the ON state unless a sufficiently negative voltage is applied to the gate electrode relative to the source or power electrode. In many applications, in particular in power switching circuits, it is desirable to utilize enhancement-mode (or E-mode) devices, e.g., devices with a positive threshold voltage, as this can simplify the form of the signals applied by a gate-drive circuit to the device and can prevent accidental turn on of the device in case of device or circuit failure. Reliable fabrication and manufacturing of high-voltage III-N E-mode devices has proven to be very difficult. In some cases, a high-voltage III-N D-mode device and a low-voltage silicon-based E-mode device are combined together to form a hybrid device, which may achieve the same or similar output characteristics as a single high-voltage III-N E-mode device.

SUMMARY

In a first aspect, a method for fabricating a III-N device includes forming a III-N channel layer on a substrate, forming a III-N barrier layer on the channel layer, forming an insulator layer on the barrier layer, and forming a trench in a first portion of the device. Forming the trench can comprise removing the insulator layer and a part of the barrier layer in the first portion of the device, such that a remaining portion of the barrier layer in the first portion of the device has a thickness away from a top surface of the channel layer, the thickness being within a predetermined range. Forming the trench may further include annealing the III-N device in a gas ambient including oxygen at an elevated temperature to oxidize the remaining portion of the barrier layer in the first portion of the device, and removing the oxidized remaining portion of the barrier layer in the first portion of the device.

In a second aspect, a method of fabricating a device includes providing a second III-N layer on a first III-N layer, where the second layer comprises aluminum as a group-III element and the first III-N layer comprises gallium or indium but not aluminum as a group-III element, providing an insulator layer on the second III-N layer, and forming a trench in a first portion of the device. Forming the trench can comprise removing the insulator layer to expose a portion of the second III-N layer in the first portion of the device, annealing the device in a gas ambient including oxygen at an elevated temperature to oxidize the exposed portion of the second III-N layer in the first portion of the device, and removing the oxidized exposed portion of the second III-N layer and exposing a top surface of the first III-N layer in the first portion of the device.

In a third aspect, a III-N device includes a III-N material structure with a III-N channel layer and a III-N barrier layer, a source contact and a drain contact electrically coupled to the channel layer, an insulator layer on the III-N material structure, and a gate insulator at least partially in a trench, and also on a top surface of the channel layer. The trench extends though the insulator layer and into the III-N material structure, with the portion of the trench that extends into the III-N material structure having first sidewalls that are substantially more vertical than second sidewalls of the portion of the trench that is through the insulator layer. The device further includes a gate electrode deposited conformally on top of the gate insulator and at least partially in the trench, where the gate electrode is positioned between the source and drain contacts.

In a fourth aspect, a transistor includes a semiconductor material structure with a conductive channel, a source contact and a drain contact which are electrically coupled to the conductive channel, and an insulator layer on the semiconductor material structure. The transistor further includes a gate insulator on the semiconductor material structure, where the gate insulator includes an amorphous $Al_xSi_yN$ film with $y/x<1/3$, and a gate electrode on top of the gate insulator and position between the source and drain contacts.

In a fifth aspect, a method of fabricating a nitrogen polar III-N device includes providing a III-N material structure with a second III-N layer on a first III-N layer, the second III-N layer comprising aluminum as a group-III element and the first III-N layer comprising gallium or indium but not aluminum as a group-III element, providing a masking layer on an N-face of the second III-N layer in a second portion of the device but not in a first portion of the device, such that the second III-N layer is exposed in the first portion but not the second portion of the device, annealing the device in a gas ambient including oxygen at an elevated temperature to oxidize the exposed portion of the second III-N layer in the first portion of the device; and removing the oxidized exposed portion of the second III-N layer in the first portion of the device to expose a top surface of the first III-N layer in the first portion of the device.

In a sixth aspect, a method for fabricating a III-N device includes forming a III-N channel layer on a substrate, forming a second III-N barrier layer on the channel layer, forming a III-N etch stop layer on the second III-N barrier layer, forming a first III-N barrier layer on the III-N etch stop layer, forming an insulator layer on the first III-N barrier layer, and forming a trench in a first portion of the device. Forming the trench includes removing the insulator layer in the first portion of the device, wherein a portion of the first III-N barrier layer in the first portion of the device has a thickness away from a top surface of the channel layer, the thickness being within a predetermined thickness range, annealing the III-N device in a gas ambient including oxygen at an elevated temperature to oxidize the portion of the first III-N barrier layer in the first portion of the device, and removing the oxidized portion of the first III-N barrier layer in the first portion of the device.

In a seventh aspect, a method of forming a III-N device includes forming a III-N channel layer on a substrate, forming a III-N barrier layer on the channel layer, forming a III-N etch stop layer on the III-N barrier layer, forming a p-type III-N layer on the III-N etch stop layer, forming a mask layer on the p-type III-N layer in a first portion of the device, and forming a trench in a second portion of the device. Forming the trench includes annealing the III-N device in a gas ambient including oxygen at an elevated temperature to oxidize the p-type III-N layer in the first portion of the device and removing the oxidized portion of the p-type III-N layer in the first portion of the device.

The foregoing and other embodiments can each optionally include one or more of the following features, alone or in combination. A portion of the trench that is through the barrier layer can include vertical sidewalls, and a portion of the trench that is through the insulator layer can include slanted sidewalls. Forming the trench can include exposing the top surface of the channel layer in the first portion of the device. Removing the oxidized remaining portion of the barrier layer in the first portion of the device can include wet etching the oxidized remaining portion of the barrier layer. Removing the insulator layer and the part of the barrier layer in the first portion of the device can include dry etching the insulator layer and the part of the barrier layer in the first portion of the device. Wet etching can include chemically etching the III-N device in an alkaline solution. Removing the insulator layer and the part of the barrier layer in the first portion of the device can include removing the insulator layer in the first portion of the device by dry etching in a first gas ambient to expose a second top surface of the barrier layer, as well as removing the part of the barrier layer in the first portion of the device by dry etching in a second gas ambient which is different from the first gas ambient. The insulator layer can include a silicon nitride layer and the barrier layer can include an aluminum gallium nitride ($Al_xGa_{1-x}N$) layer, wherein the second gas ambient can include $SF_6$ and the third gas ambient includes $Cl_2$.

The barrier layer can include an Al-based III-N layer that can be oxidized by the annealing, and the channel layer can include a III-N layer without Aluminum (Al) that is resistant to being oxidized during the annealing. The predetermined thickness range can be from about 3 nm to 10 nm. The elevated temperature can be between 300° C. and 700° C. Forming an insulator layer can include forming a first silicon nitride layer by metal organic chemical vapor deposition (MOCVD) as the insulator layer, and fabricating the III-N device can further include forming a second silicon nitride layer by plasma enhanced chemical vapor deposition (PECVD) as an etch mask layer before forming the trench, as well as removing the etch mask layer from the insulator layer by wet etching in an acid solution after removing the oxidized remaining portion of the barrier layer in the first portion of the device. Fabricating the III-N device can also include forming a gate insulator at least partially in the trench, wherein the gate insulator is formed on the top surface of the channel layer in the first portion of the device. Forming the gate insulator can include depositing an amorphous aluminum silicon nitride ($Al_xSi_yN$) film in the trench. A thickness of the amorphous $Al_xSi_yN$ film can be between 1 nm and 60 nm. A ratio of the silicon fractional composition to the Al fractional composition y/x in the $Al_xSi_yN$ film is less than ⅓. Depositing the amorphous $Al_xSi_yN$ film can include forming the amorphous $Al_xSi_yN$ film at a growth or deposition temperature higher than 500° C. Fabricating the III-N device can include forming source and drain contacts electrically coupled to the channel layer, and forming a gate electrode on the gate insulator at least partially in the trench between the source and drain contacts. Forming the III-N barrier layer can include forming the III-N barrier layer with a higher bandgap than the channel layer, such that a conductive channel is induced in the channel layer, and forming the source and drain contacts can include forming respective ohmic contacts for the source and drain contacts that are electrically coupled to the conductive channel.

When fabricating a device, oxidizing the exposed portion of the second III-N layer can cause the second III-N layer in the first portion of the device to be oxidized all the way to an interface between the second III-N layer and the first III-N layer but does not cause any of the first III-N layer to be oxidized. Fabricating a device can also include forming an electrode in the trench. A second insulator layer can be formed prior to forming the electrode, wherein the second insulator layer is between the electrode and the top surface of the first III-N layer in the trench. The electrode can be a gate electrode, a conductive channel can be induced adjacent to an interface between the first and second III-N layers due to a compositional difference between the first and second III-N layers, and fabricating a device can further include forming a source and drain electrode, the source and drain electrodes being on opposite sides of the gate electrode and being electrically coupled to the conductive channel. The conductive channel can be depleted of mobile charge below the trench when 0V is applied to the gate electrode relative to the source electrode, but becomes populated with mobile charge when a sufficiently positive voltage is applied to the gate electrode relative to the source electrode. The electrode can include an extending portion which extends over the insulator layer towards the drain electrode. The second insulator layer can include an extending portion that is between the extending portion of the electrode and the insulator layer. Fabricating a device can also include partially removing the second III-N layer in the first portion of the device after the removing of the insulator layer in the first portion of the device but prior to the annealing of the device, causing a remaining portion of the second III-N layer in the first portion of the device to have a first thickness which is less than a second thickness of portions of the second III-N layer that are on opposite sides of the trench. The first thickness can be between 3 nm and 10 nm.

In the III-N device, the first sidewalls of the trench can be vertical and the second sidewalls of the trench can be slanted. The gate electrode can include extending portions that are outside the trench and extend towards but are separated from the source and drain contacts, respectively.

The barrier layer can have a larger bandgap than the channel layer, such that a conductive channel is induced in the channel layer. The source and drain contacts can form respective ohmic contacts that are electrically coupled to the conductive channel. The conductive channel can be discontinuous in a region of the channel layer beneath the trench when 0V is applied to the gate electrode relative to the source contact, but is continuous when a voltage greater than a threshold voltage of the device is applied to the gate electrode relative to the source contact, the threshold voltage being greater than 0V. The III-N device can function as an enhancement-mode field effect transistor having the threshold voltage of more than 2V and a threshold voltage hysteresis of less than 0.5V. The gate insulator can include an amorphous $Al_xSi_yN$ film. A thickness of the amorphous $Al_xSi_yN$ film can be between 1 nm and 60 nm. The III-N channel layer can include a III-N layer without Aluminum (Al) and the III-N barrier layer can include an Al-based III-N layer.

In the transistor, a thickness of the amorphous $Al_xSi_yN$ film can be between about 1 nm and 60 nm. The semiconductor material structure can include a III-N channel layer and a III-N barrier layer on the III-N channel layer, and wherein the III-N barrier layer has a larger bandgap than the III-N channel layer, such that the conductive channel is induced in the III-N channel layer near an interface between the III-N channel layer and the III-N barrier layer. At room temperature, a threshold voltage of the transistor can be more than 2 V and a threshold voltage hysteresis can be less than 0.5 V.

When fabricating a nitrogen polar III-N device, the top surface of the first III-N layer can be an N-face of the first III-N layer. Fabricating a nitrogen polar III-N device can also include providing a third III-N layer on an opposite side of the first III-N layer from the second III-N layer, wherein a compositional difference between the first III-N layer and the third III-N layer causes a conductive channel to be induced in the first III-N layer adjacent to an interface between the first and third III-N layers. Additionally, fabricating a nitrogen polar III-N device can include forming a gate electrode over the second portion of the device and forming a source contact electrically coupled to the conductive channel in the first portion of the device, wherein the second III-N layer is sufficiently thick to ensure that the conductive channel is depleted of mobile charge in the second portion of the device when 0V is applied to the gate electrode relative to the source contact. Prior to forming the gate electrode, the insulator layer can be removed from the second portion of the device.

Fabricating a III-N device can further include extending the trench into the first III-N barrier layer prior to the annealing of the III-N device. The extending of the trench into the first III-N barrier layer can include etching part way through the first III-N barrier layer in the first portion of the device. The III-N etch stop layer can include a III-N layer without Aluminum (Al), and the first III-N barrier layer can include an Al-based III-N layer.

As used herein, the terms III-Nitride or III-N materials, layers, devices, etc., refer to a material or device comprised of a compound semiconductor material according to the stoichiometric formula $B_wAl_xIn_yGa_zN$, where w+x+y+z is about 1 with $0 \le w \le 1$, $0 \le x \le 1$, $0 \le y \le 1$, and $0 \le z \le 1$. III-N materials, layers, or devices, can be formed or prepared by either directly growing on a suitable substrate (e.g., by metal organic chemical vapor deposition), or growing on a suitable substrate, detaching from the original substrate, and bonding to other substrates.

As used herein, two or more contacts or other items such as conductive channels or components are said to be "electrically connected" if they are connected by a material which is sufficiently conducting to ensure that the electric potential at each of the contacts or other items is intended to be the same, e.g., is about the same, at all times under any bias conditions.

As used herein, "blocking a voltage" refers to the ability of a transistor, device, or component to prevent significant current, such as current that is greater than 0.001 times the operating current during regular conduction, from flowing through the transistor, device, or component when a voltage is applied across the transistor, device, or component. In other words, while a transistor, device, or component is blocking a voltage that is applied across it, the total current passing through the transistor, device, or component will not be greater than 0.001 times the operating current during regular conduction. Devices with off-state currents which are larger than this value exhibit high loss and low efficiency, and are typically not suitable for many applications, especially power switching applications.

As used herein, a "high-voltage device", e.g., a high-voltage switching transistor, HEMT, bidirectional switch, or four-quadrant switch (FQS), is an electronic device which is optimized for high-voltage applications. That is, when the device is off, it is capable of blocking high voltages, such as about 300V or higher, about 600V or higher, or about 1200V or higher, and when the device is on, it has a sufficiently low on-resistance ($R_{ON}$) for the application in which it is used, e.g., it experiences sufficiently low conduction loss when a substantial current passes through the device. A high-voltage device can at least be capable of blocking a voltage equal to the high-voltage supply or the maximum voltage in the circuit for which it is used. A high-voltage device may be capable of blocking 300V, 600V, 1200V, 1700V, 2500V, or other suitable blocking voltage required by the application. In other words, a high-voltage device can block all voltages between 0V and at least $V_{max}$, where $V_{max}$ is the maximum voltage that can be supplied by the circuit or power supply, and $V_{max}$ can for example be 300V, 600V, 1200V, 1700V, 2500V, or other suitable blocking voltage required by the application.

As used herein, a "III-N device" is a device based on III-N heterostructures. The III-N device can be designed to operate as an E-mode transistor or switch. The III-N device can be a high-voltage device suitable for high voltage applications. In such a high-voltage device, when the device is biased off (e.g., the voltage on the gate relative to the source is less than the device threshold voltage), it is at least capable of supporting all source-drain voltages less than or equal to the high-voltage in the application in which the device is used, which for example may be 100V, 300V, 600V, 1200V, 1700V, 2500V, or higher. When the high voltage device is biased on (e.g., the voltage on the gate relative to the source or associated power terminal is greater than the device threshold voltage), it is able to conduct substantial current with a low on-voltage (i.e., a low voltage between the source and drain terminals or between opposite power terminals). The maximum allowable on-voltage is the maximum on-state voltage that can be sustained in the application in which the device is used.

The details of one or more disclosed implementations of the subject matter described in this specification are set forth in the accompanying drawings and the description below. Additional features and variations may be included in the implementations as well. For example, an FQS having N-polar III-N layers can be formed by including a second gate structure between electrodes 1122 and 1124 in the device of FIG. 11G. Other features, aspects, and advantages will become apparent from the description, the drawings and the claims.

DESCRIPTION OF DRAWINGS

FIGS. 11A-11F illustrate an example process for forming the device of FIG. 11G.

FIGS. 12A-12F illustrate an example process for forming another III-N device.

FIGS. 14A-14F illustrate an example process for forming yet another III-N device.

Like reference numbers and designations in the various drawings indicate like elements.

DETAILED DESCRIPTION

Figure 1:
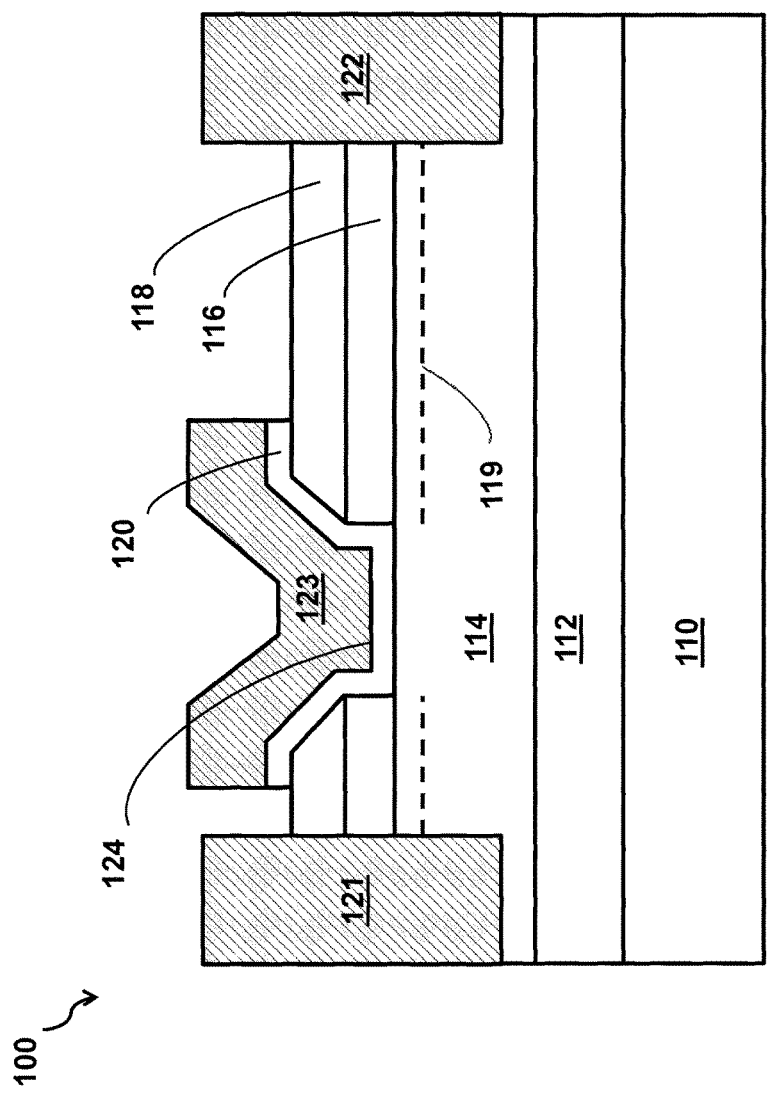
FIG. 1 is a cross-sectional view of an example III-N device.

FIG. 1 is a cross sectional view of an example III-N device 100. The III-N device 100 can be a III-N transistor or switch, and in particular a high-voltage III-N enhancement-mode field effect transistor.

The III-N device 100 includes a substrate layer 110. The substrate layer 110 can be a substrate made of, for example, Silicon (Si), Silicon Carbide (SiC), Sapphire ($Al_2O_3$), Aluminum Nitride (AlN), Gallium Nitride (GaN), or any other suitable substrate upon which III-N materials can be formed.

A buffer layer 112 is formed on the substrate layer 110. The buffer layer 112 can be a III-N buffer layer, e.g., a GaN layer, an $Al_xGa_{1-x}N$ layer, or the like. The buffer layer 112 can be rendered insulating or substantially free of n-type mobile carriers, e.g., by including dislocations or point defects in the buffer layer 112, and/or by doping the buffer layer 112 with compensating elements, e.g., Iron (Fe), Carbon (C), and/or Magnesium (Mg). The buffer layer 112 can have a substantially uniform composition throughout the layer. In some implementations, one or more compositions vary throughout the buffer layer 112. For example, the buffer layer 112 can be graded, e.g., by grading an Al composition in the buffer layer 112. In some cases, the buffer layer 112 is substantially thicker than any of the other III-N layers in the III-N device 100.

The III-N device 100 includes a channel layer 114 formed on the buffer layer 112. The channel layer 114 can be a III-N layer, e.g., an undoped GaN layer or a slightly or unintentionally doped GaN layer. In some examples, the channel layer 114 is a III-N layer without Al composition, for example GaN or $In_zGa_{1-z}N$.

A barrier layer 116 is formed on the channel layer 114. The barrier layer 116 and the channel layer 114 can have different compositions or III-N materials from one another. The compositions or III-N materials are selected such that the barrier layer 116 can have a larger bandgap than the channel layer 114. In some examples, the barrier layer 116 is an Al-based III-N layer, e.g., an $Al_xGa_{1-x}N$ layer, an $Al_yIn_{1-y}N$ layer, or an AlInGaN layer. The channel layer can be an undoped GaN layer. The barrier layer 116 can be n-doped or can contain no significant concentration of doping impurities. In the case that the barrier layer 116 is undoped, polarization fields can exist between the channel layer 114 and the barrier layer 116, such that a fixed charge is induced at or adjacent to the interface between layers 114 and 116.

The band edge discontinuity in the conduction band of the III-N material structure, resulting from the bandgap difference and/or the difference in electron affinity between layers 114 and 116, in combination with the doping of the barrier layer 116 or introduced polarization, can induce a conductive channel 119 in the channel layer 114, e.g., near an interface between the channel layer 114 and the barrier layer 116, as illustrated in FIG. 1. The conductive channel 119 can include a 2-dimentional electron gas (2DEG) channel, e.g., between source contact 121 and gate contact 123, as well as gate contact 123 and drain contact 122. As shown in FIG. 1, when the device 100 is in the OFF state (i.e., the gate contact 123 is biased relative to the source contact 121 at a voltage lower than the device threshold voltage), the conductive channel 119 is depleted of mobile charge below the gate electrode 123, and so the 2DEG is discontinuous between the source contact 121 and the drain contact 122. When the device 100 is in the ON state (i.e., the gate contact 123 is biased relative to the source contact 121 at a voltage lower than the device threshold voltage), the conductive channel 119 below the gate electrode 123 is populated with mobile charge (not shown in FIG. 1), and the 2DEG is continuous from the source all the way to the drain. In some implementations, the source and drain contacts 121 and 122, respectively, form ohmic contacts electrically coupled to, electrically connected to, or contacting the 2DEG channel. The gate contact 123 can modulate a portion of the 2DEG channel in a gate region, e.g., directly beneath the gate contact 123.

The III-N device 100 can also include an insulator layer 118. The insulator layer 118 can be a passivation layer, preventing or suppressing dispersion by preventing or suppressing voltage fluctuations at the uppermost III-N surface. The insulator layer 118 can be made of $Si_xN_y$, $Al_2O_3$, $SiO_2$, $Al_xSi_yN$, or the like, and can be prepared by metal organic chemical vapor deposition (MOCVD), low pressure chemical vapor deposition (LPCVD), plasma enhanced chemical vapor deposition (PECVD), chemical vapor deposition (CVD), sputtering, atomic layer deposition (ALD), high density chemical vapor deposition, or any suitable deposition process. In a particular example, the insulator layer 118 is a Silicon Nitride ($Si_xN_y$) layer formed by MOCVD.

The source contact 121, e.g., a source electrode, and the drain contact 122, e.g., a drain electrode, can be formed by metal stacks in contact with one of the III-N layers, e.g., the channel layer 114. The metal stacks can be Ti/Al/Ni/Au, Ti/Al, or the like. The source contact 121 and the drain contact 122 can be formed by metal evaporation and post-deposition annealing processes. Other ohmic contact processes can also be used.

To shape the electric field in a high-voltage-field region of the III-N device 100, a trench 124 is formed to reduce a peak electric field and increase a device breakdown voltage or threshold voltage, thereby allowing for high voltage operation. The trench 124 can also cause the device 100 to operate in enhancement mode (i.e., to be an E-mode device), The trench 124 can be formed by removing part of the insulator layer 118 and part or all of the barrier layer 116 in a trench shape. The residual damage in the channel layer, as well as the depth and shape of the trench, are crucial for achieving enhancement mode operation along with a low device on-resistance Ron, as further described below.

In some implementations, dry etching techniques, e.g., plasma etching, digital plasma etching, or reactive ion etching (RIE), are used to form a trench or recess structure. The dry etching techniques can cause ion bombardment damage, which can reduce the channel carrier mobility. These techniques also have low etching selectivity with respect to III-Nitride materials. That is, it is difficult to selectively etch one composition of III-Nitride materials without substantially etching a different composition of III-Nitride materials using these techniques. Furthermore, it can be difficult to recover a surface with ion bombardment damage. Etching selectivity can also be important for III-N epitaxy films, as each layer grown epitaxially on a substrate has thickness and composition variations from a center of a wafer to an edge of the wafer. In some cases, the dry etching techniques have little etching selectivity between a barrier layer and a channel layer. Thus, large threshold voltage variations can be caused by different etching depths.

To realize an enhancement-mode transistor using a III-N device structure, it can be important to control etching depth in the trench or recess. A device having the III-N material structure of device 100 but lacking the trench 124 typically operates in depletion mode. Including a recess or trench 124 in the III-N material structure in the gate region of the device causes the device threshold voltage to shift to a lower value. If the etching depth is not deep enough, such that the shift in threshold voltage is small, the III-N device may still remain a depletion mode device, exhibiting normally-on characteristics. If the etching depth is too deep and extends into the channel layer, current communications between the conductive channel underneath gate contact and conductive channels in the device access regions (i.e., the regions between the source and gate and between the gate and drain) can be cut off, even when the device is biased in the ON state. In this case, the III-N device may have a low current density or may not be operational in the ON state, even though normally-off E-mode operation can be realized. Although dry etching rates can be calibrated to reasonable accuracy, variations in barrier layer thickness between different wafers due to growth condition fluctuations of III-N expitaxy films, as well as variations across a single wafer, may cause low manufacturing yield.

In some implementations, as discussed in further details in FIGS. 2A-2B and FIGS. 3A-3B, a wet etching technique can be used in the formation of trench 124. Using the wet etching technique, the barrier layer 116 in the trench 124 can be completely removed and the etching can stop precisely on a top surface of the channel layer 114 in a self-aligned style. In some examples, the barrier layer 116 can be completely removed under a tolerance of barrier layer thickness fluctuations, which can improve the etch depth uniformity over the wafer and improve manufacturing yield.

Trench etch cross-sections are typically either rectangular or trapezoidal, i.e., trenches either have vertical sidewalls or sloping sidewalls, but not both. In a device such as device 100, having vertical sidewalls throughout the trench is not desirable, since conformal deposition of defect-free gate dielectric and gate metal can be challenges in III-N device structures having recesses or trenches with vertically shaped sidewalls. However, having sloped sidewalls throughout the trench, and in particular in the portion of the trench that is through the III-N material, is also not desirable because thickness variations in the barrier layer adjacent to the bottom of the trench reduces 2DEG charge density and increases resistance of the access regions in the portion of the channel directly adjacent to but not directly under the bottom of the trench. It is therefore desirable that the trench sidewalls are vertical in the barrier layer 116 but sloped in the overlying insulator layer 118.

After wet etching, as indicated in FIG. 1, the trench 124 can have vertical sidewalls in the barrier layer 116 and slanted sidewalls in the insulator layer 118, as discussed in further details below. A top surface of the channel layer 114 is exposed in the trench 124. The trench 124 extends from the top surface of the channel layer 114 through the barrier layer 116 and the insulator layer 118 to a top surface of the insulator layer 118.

A gate insulator 120, e.g., a gate insulator layer or a gate dielectric layer, is grown or deposited conformally at least partially in the trench 124. The gate insulator 120 can be on the top surface of the channel layer 114. The gate insulator 120 can extend at least from the top surface of the channel layer 114 to the top surface of the insulator layer 118. The gate insulator 120 can also have vertical sidewalls in the barrier layer 116 and slanted sidewalls in the insulator layer 118.

The gate insulator 120 can, for example, be formed of or include Aluminum Oxide ($Al_2O_3$), Silicon Dioxide ($SiO_2$), $Si_xN_y$, or any other wide bandgap insulator. In some examples, the gate insulator 120 is an $Al_xSi_yN$ layer, e.g., an amorphous $Al_xSi_yN$ layer or a polycrystalline $Al_xSi_yN$ layer, where x and y represent the relative fractional compositions of non-nitrogen elements in the $Al_xSi_yN$ layer. That is, $x/(x+y)$ is the percent of non-nitrogen elements in the $Al_xSi_yN$ layer that are constituted by aluminum, $y/(x+y)$ is the percent of non-nitrogen elements in the $Al_xSi_yN$ layer that are constituted by silicon, and $x/y$ is the ratio of aluminum to silicon in the $Al_xSi_yN$ layer. In a particular example, as discussed in further details below, the gate insulator 120 includes an amorphous $Al_xSi_yN$ film that provides high gate bias and low gate leakage. The amorphous $Al_xSi_yN$ film can have a thickness of between about 1 nm and 100 nm, for example between 1 nm and 60 nm.

In some implementations, the gate insulator 120 is a ternary compound such as an $Al_xA_yN$ layer, where A is an element from the fourth group of the periodic table, e.g., an amorphous $Al_xSi_yN$ layer or a polycrystalline $Al_xSi_yN$ layer. Gate insulator 120 could also be a wideband gap quaternary insulator such as $Al_xM_yA_zN$, where M is a transition metal element, A is an element of the fourth group of the periodic table, and x, y, and z are the relative fractional compositions of non-nitrogen elements in the $Al_xM_yA_zN$ layer. The quaternary insulator reduces to the ternary when either y or z is equal to zero. Although amorphous films may be preferable, other mixed phase matrices could also be used.

Next, the gate contact 123, e.g., a gate electrode, is formed conformally on the gate insulator 120 at least partially in the recess 124. Similarly to the gate insulator 120, the portion of the gate contact 123 that is in the trench and adjacent to the barrier layer 116 can be oriented vertically, and the portion of the gate contact 123 that is in the trench and adjacent to the insulator layer 118 can be slanted. In some implementations, the gate contact 123 includes extending portions that are outside the trench 124 and extend towards the source contact 121 and/or the drain contact 122, respectively. The extending portions are separated from the source contact 121 and the drain contact 122, respectively. The extending portions of the gate contact 123 can function as field plates for the III-N device 100. In some examples, the extending portions of the gate contact at least partially include the slanted portions of the gate contact and can function as slant field plates, which may improve device performance.

The gate contact 123 can be formed as metal stacks, e.g., nickel/gold (Ni/Au), and can be deposited by metal evaporation or sputtering or chemical vapor deposition. The gate contact 123 may alternatively be another conductive material or material stack including one or more materials having a large work function, such as a semiconductor material having a large work function (e.g., p-type poly-silicon, indium tin oxide, or titanium nitride). A post-deposition annealing process may optionally be performed after deposition of the gate contact 123. Finally, the gate contact 123 can be used as an etch mask to etch the gate insulator 120, such that the gate insulator 120 remains directly beneath the gate contact 123 but is etched away everywhere else.

As illustrated in FIG. 1, when 0V (or any voltage less than the device threshold voltage) is applied to the gate contact 123 relative to the source contact 121, the conductive channel 119 is discontinuous in a region of the channel layer 114 directly beneath the trench 124 in the gate region of the III-N device 100. As a consequence of the discontinuity of the conductive channel 119, the device channel between the source and drain contacts is not conductive when 0 V is applied to the gate contact 123 relative to the source contact 121, but is readily conductive when a sufficiently positive voltage, e.g., above a device threshold voltage, is applied to the gate contact 123 relative to the source contact 121. Thus, the III-device 100 can function as a high-voltage enhancement-mode device for high voltage applications. The III-N device 100 can be a transistor, a bidirectional switch or four quadrant switch (FQS), and/or any suitable semiconductor device.

Figure 2A:
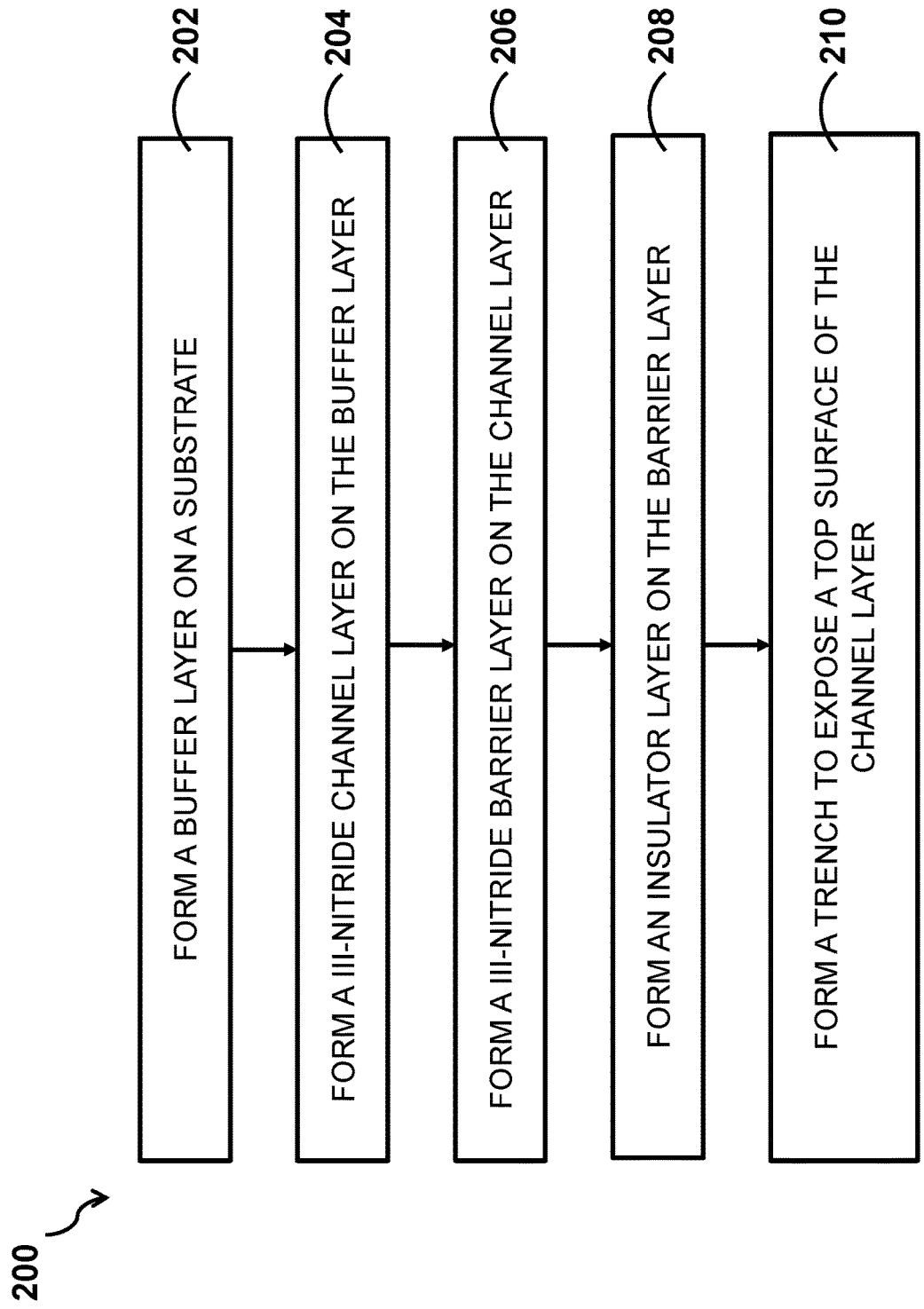
FIGS. 2A-2B are flow diagrams of an example process for forming the III-N device of FIG. 1.
Figure 2B:
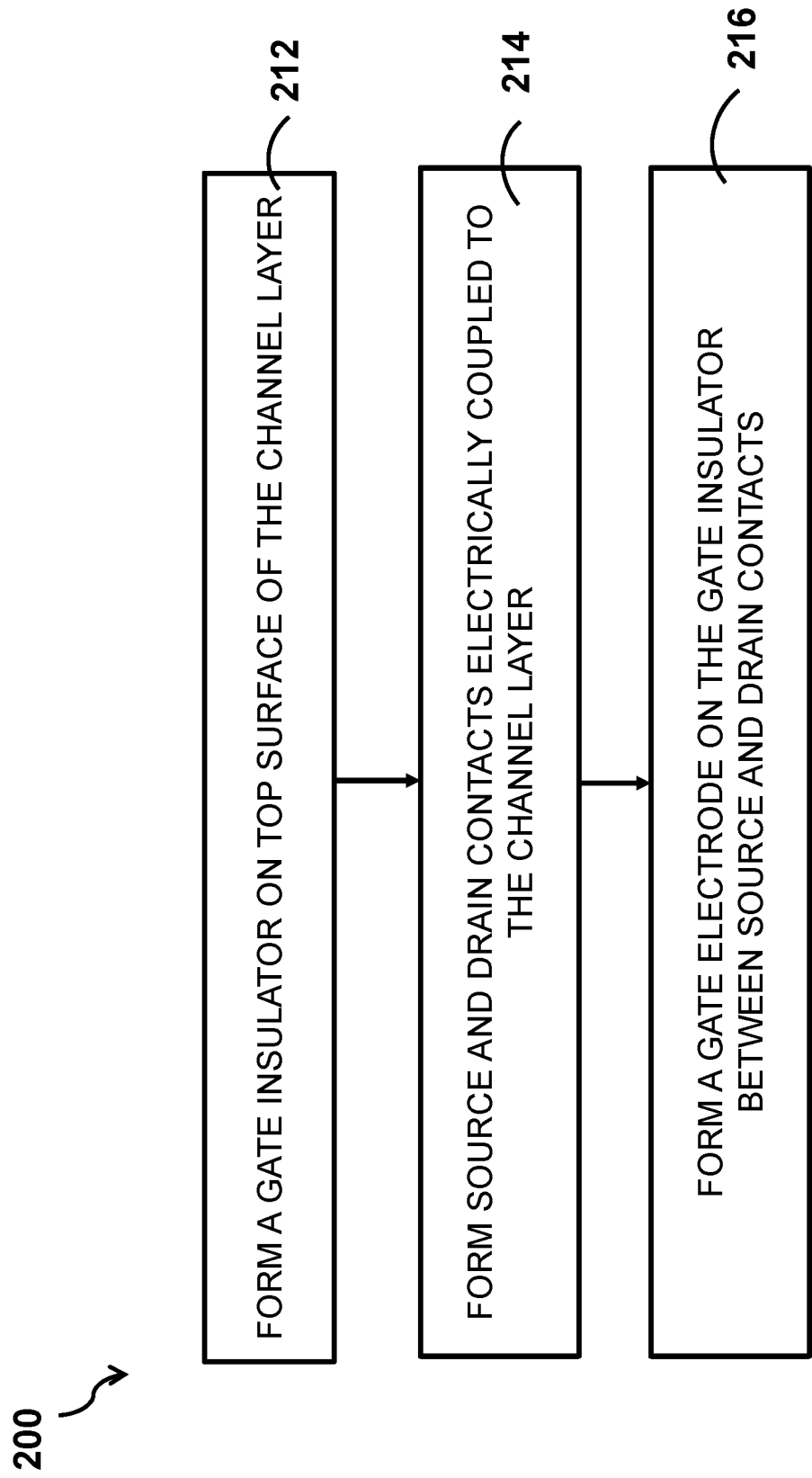

FIGS. 2A-2B show an example process 200 for forming a III-N device. The process 200 can be utilized to form the III-N device 100 of FIG. 1.

Referring to FIG. 2A, the process 200 includes forming a buffer layer on a substrate (202). The buffer layer and the substrate can be the buffer layer 112 and the substrate layer 110 of FIG. 1, respectively. The substrate can be a silicon wafer. The buffer layer can be formed by either directly growing the buffer layer on the substrate, or alternatively by growing the buffer layer on a first substrate, detaching the buffer layer from the first substrate, and bonding the buffer layer to the substrate. As noted above, forming the buffer layer (step 202) can also include doping the buffer layer with compensating elements.

Next, a III-N channel layer is formed on the buffer layer (step 204). The III-N channel layer can be the channel layer 114 of FIG. 1. The III-N channel layer can be an undoped III-N layer, e.g., an undoped GaN layer. In a particular example, the III-N channel layer is an undoped GaN layer and is substantially free of Al.

A III-N barrier layer is then formed on the channel layer (step 206). The III-N barrier layer can be the barrier layer 116 of FIG. 1. The III-N barrier layer includes different composition or III-N materials from the channel layer, such that the barrier layer has a larger bandgap than the channel layer and a conductive channel, e.g., a 2DEG channel, can be induced in the channel layer. In some examples, the barrier layer is an $Al_xGa_{1-x}N$ layer. The barrier layer can have a thickness of about 30 nm. In particular implementations, the III-N barrier layer is an $Al_xIn_yGa_{1-x-y}N$ layer, where x and y are the respective aluminum and indium fractional compositions, x+y is the gallium fractional composition, $0<x\leq1$, $0\leq y<1$, and $0\leq x+y<1$.

Next, an insulator layer is formed on the barrier layer (step 208). The insulator layer can be the insulator layer 118 of FIG. 1. As noted above, the insulator layer can be made of $Si_xN_y$, $Al_2O_3$, $SiO_2$, $Al_xSi_yN$, or the like, and can be deposited by MOCVD, LPCVD, PECVD, CVD, HDPCVD, sputtering, activated reactive sputtering, ALD, plasma assisted ALD, or any suitable deposition process. In a particular example, the insulator layer is a $SiN_x$ layer formed by MOCVD.

A trench is then formed to expose a top surface of the channel layer (step 210). The trench can be the trench 124 of FIG. 1. As discussed in further details in FIGS. 3A and 3B, formation of the trench can include using a wet etching technique. After wet etching, the formed trench can have vertical sidewalls in the barrier layer 316 and slanted sidewalls in the insulator layer 318. The barrier layer can be removed in the trench region and the top surface of the channel layer 314 can be exposed in the trench. The trench can extend from the top surface of the channel layer 314 through the barrier layer 316 and the insulator layer 318 to a top surface of the insulator layer. In some examples, the conductive channel is discontinuous in a region of the channel layer directly beneath the trench when no voltages are applied to any of the device electrodes (e.g., the source, the gate, or the drain).

Referring now to FIG. 2B, a gate insulator is formed on the top surface of the channel layer (step 212). The gate insulator can be the gate insulator 120 of FIG. 1. The gate insulator is formed conformally at least partially in the trench. The gate insulator can be in direct contact with the top surface of the channel layer without barrier material therebetween. The portion of the gate insulator contacting the barrier layer can have vertical sidewalls, and the portion of the gate insulator contacting the insulator layer can have slanted sidewalls.

In some implementations, to achieve high gate bias and low gate leakage, an amorphous aluminum silicon nitride (e.g., $Al_xSi_yN$) film is grown as the gate insulator. The III-N device with the amorphous $Al_xSi_yN$ film as the gate insulator can achieve a high breakdown electrical field, low interface traps, and high temperature stability, as discussed in further details in FIGS. 6 to 9.

The amorphous $Al_xSi_yN$ film can be grown by using CVD, LPCVD, MOCVD, molecular beam epitaxy (MBE), sputter deposition, or any suitable deposition process. In some examples, the grown amorphous $Al_xSi_yN$ film has a thickness of between 1 nm and 100 nm, for example between about 1 nm and 60 nm.

During formation of the $Al_xSi_yN$ film, a number of growth or deposition conditions can be optimized to ensure that the resulting $Al_xSi_yN$ film is amorphous (rather than polycrystalline). For example, the growth or deposition temperature, chamber pressure, and/or Si/Al ratio can be optimized to realize an amorphous $Al_xSi_yN$ film. Generally, decreasing the growth or deposition temperature and increasing the Si/Al ratio tends to cause the deposited $Al_xSi_yN$ film to be amorphous, rather than polycrystalline. For example, for a growth or deposition temperature of about 1000° C. or higher, the resulting $Al_xSi_yN$ can be amorphous if the Si/Al ratio is about 6/94 or greater, whereas for a growth or deposition temperature of about 800° C. or higher, the resulting $Al_xSi_yN$ can be amorphous if the Si/Al ratio is about 2/3 or greater. However, it has been found that increasing the growth or deposition temperature, and/or decreasing the Si/Al ratio, in an $Al_xSi_yN$ gate insulator film of a III-N enhancement-mode device causes the gate leakage in the device to decrease substantially as long as the $Al_xSi_yN$ is amorphous (devices with polycrystalline films have been found to exhibit substantially higher gate leakage). Hence, the deposition conditions of the $Al_xSi_yN$ gate insulator film can be optimized such that a high deposition temperature and low Si/Al ratio are maintained will still achieving an amorphous film. In some implementations, the growth or deposition temperature of the amorphous $Al_xSi_yN$ film is greater than 500° C., for example greater than 800° C. or greater than 900° C., and/or the ratio of the Si fractional composition to the Al fractional composition y/x is less than 2/3, for example less than 1/3, less than 1/9, or less than 7/93.

Figure 4:
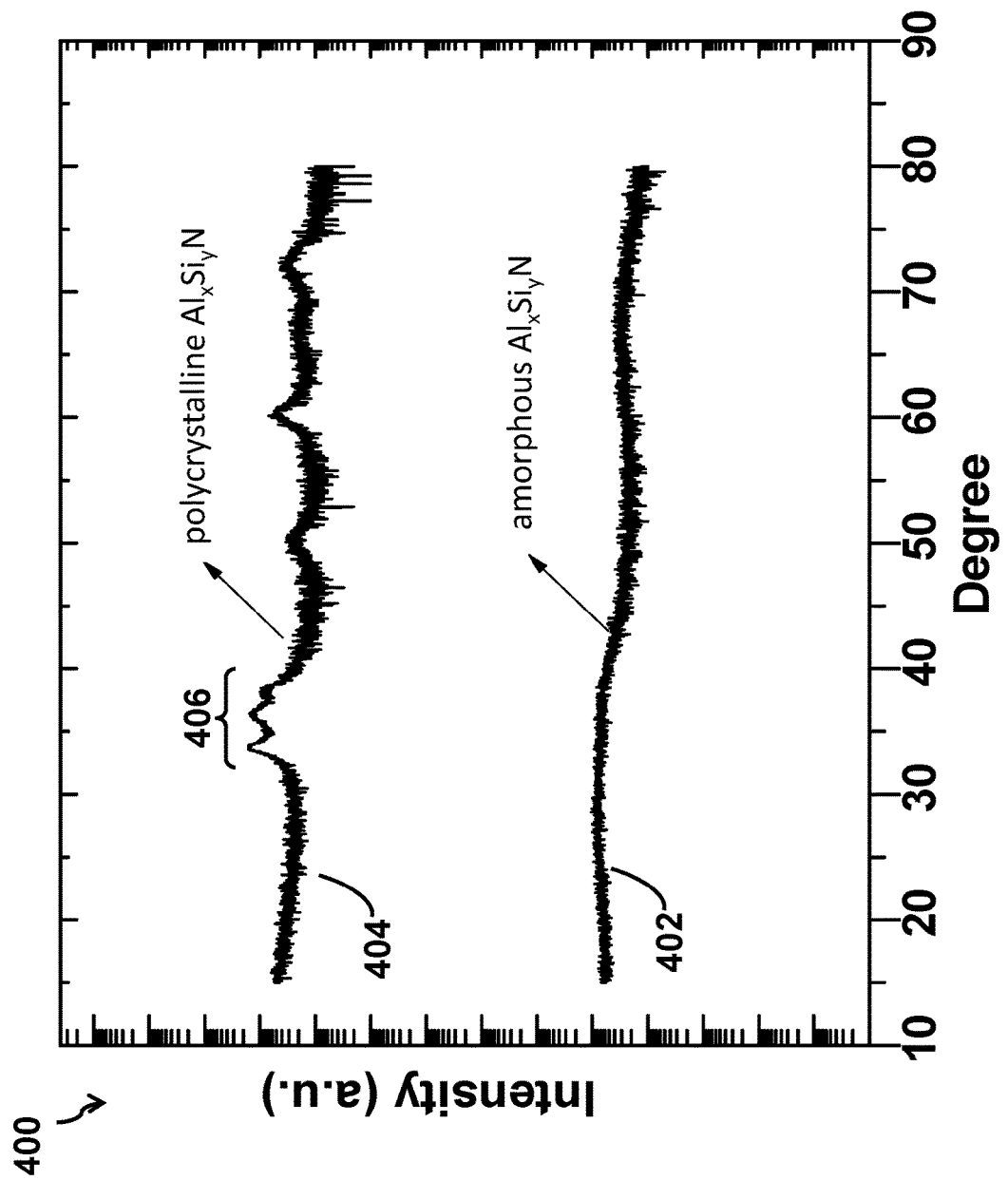
FIG. 4 shows characterization results for an amorphous $Al_xSi_yN$ film and a polycrystalline $Al_xSi_yN$ film.

Grown $Al_xSi_yN$ films can be characterized by utilizing an X-ray diffraction (XRD) grazing scan to determine whether or not any crystal grains exist. FIG. 4 shows characterization results for an amorphous $Al_xSi_yN$ film and a polycrystalline $Al_xSi_yN$ film. Peaks in the XRD curves indicate that the film includes at least portions which are crystalline or polycrystalline. As curve 402 shows, there are no peaks appearing in the scan of the amorphous $Al_xSi_yN$ film. On the other hand, as curve 404 shows, AlN crystalline peaks 406 can be detected in the polycrystalline $Al_xSi_yN$ film.

Referring back to FIG. 2B, source and drain contacts which are electrically coupled to the channel layer are then formed (step 214). The source and drain contacts can be the source contact 121 and the drain contact 122 of FIG. 1, respectively. As noted above, the source contact and the drain contact can be formed as metal stacks, e.g., Ti/Al/Ni/Au or Ti/Al, in contact with the channel layer in the III-N device, e.g., by using metal evaporation or sputtering, and optionally performing a post-deposition annealing process. In some examples, the source and drain contacts, respectively, form ohmic contacts electrically contacting or coupled to the conductive channel, e.g., the 2DEG channel, in the channel layer. The source and drain contacts may optionally be formed prior to forming the trench.

Next, a gate electrode is formed on the gate insulator between the source and drain contacts (step 216). The gate electrode can be the gate contact 123 of FIG. 1. As noted above, the gate electrode can be formed conformally on the gate insulator at least partially in the trench, by depositing metal stacks, e.g., nickel/gold (Ni/Au) using similar processes to those used for the source and drain contacts in step 214. The gate electrode can include vertical sidewalls in the trench adjacent to the barrier layer and slanted sidewalls in the trench adjacent to the insulator layer. In some implementations, the gate electrode includes extending portions that are outside the trench and extend towards but are separated from the source contact and the drain contact, respectively.

After deposition of the gate electrode, the gate electrode can further be used as an etch mask to etch the gate insulator, such that the gate insulator remains directly beneath the gate contact but is etched away elsewhere.

Figure 3A:
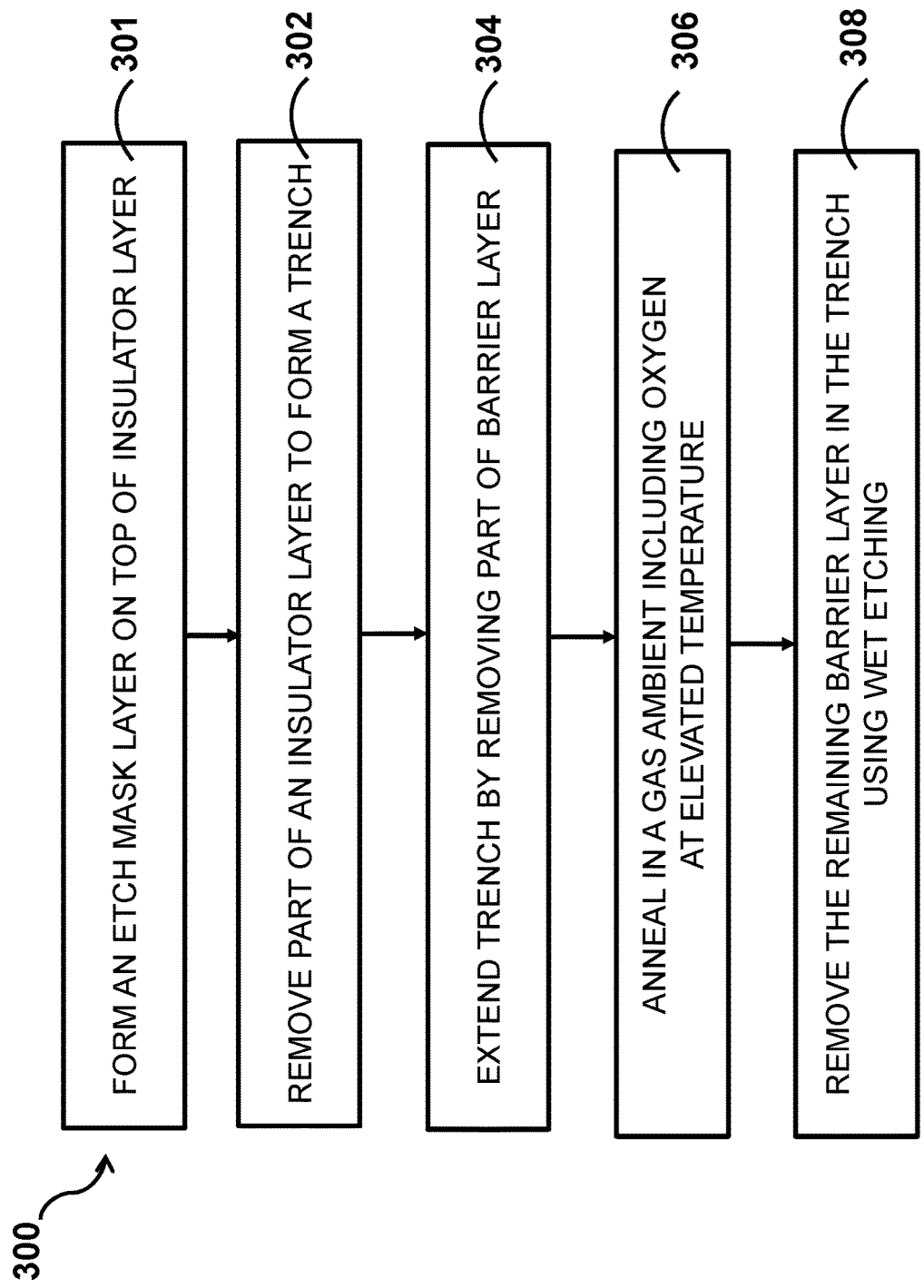
FIG. 3A is a flow diagram of an example process for forming a trench in the III-N device of FIG. 1 or FIG. 2A.
Figure 3B:
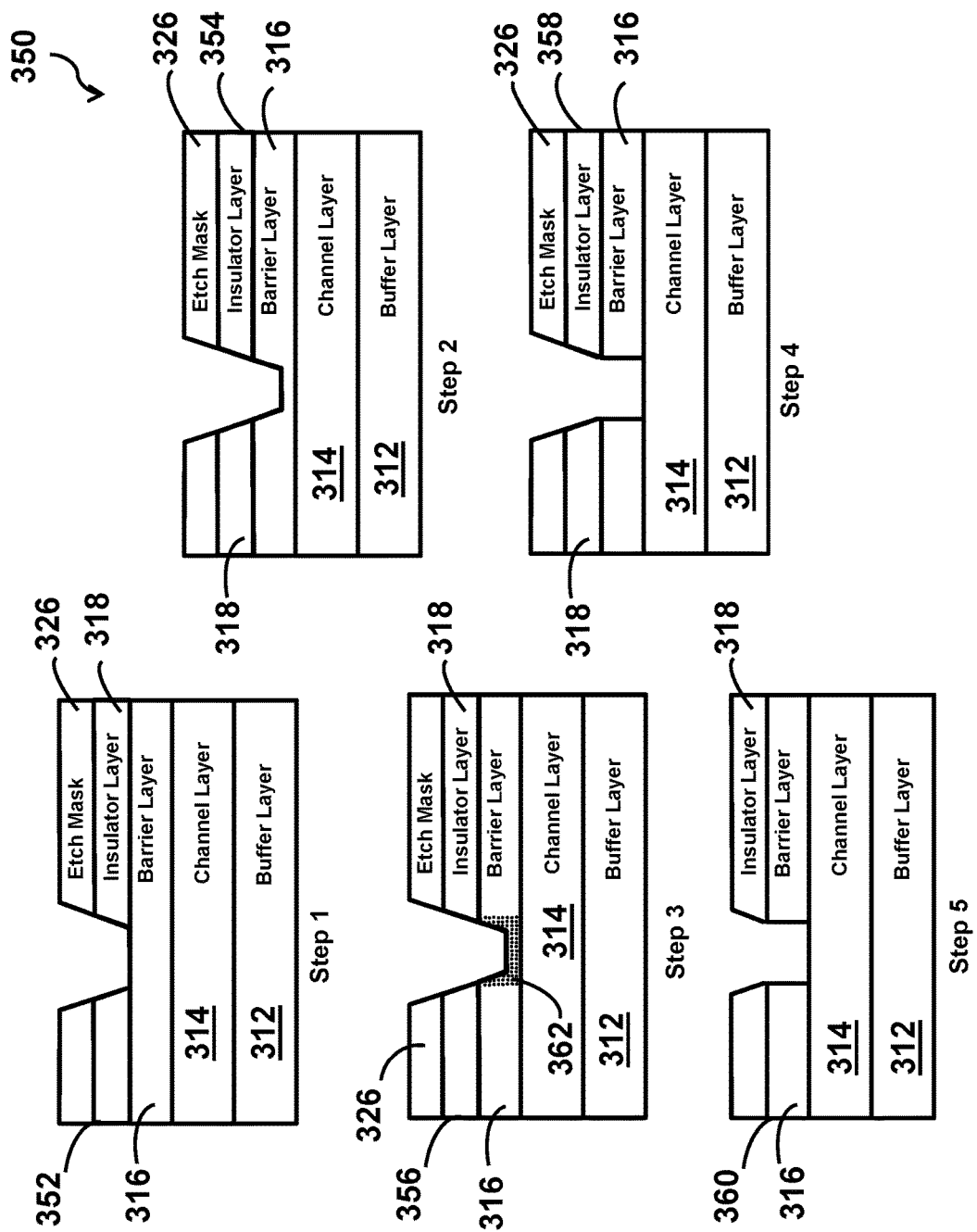
FIG. 3B illustrates the example process for forming the trench in FIG. 3A.

FIG. 3A shows an example process 300 for forming a trench in a III-N device. FIG. 3B illustrates structure configurations 350 of the III-N device of FIG. 3A in different steps, e.g., steps in the process 300. The trench and the III-N device can be the trench 124 and the III-N device 100 of FIG. 1, respectively. The process 300 can be the process 210 of FIG. 2A.

After process step 208 of FIG. 2A, the III-N device structure includes a buffer layer, a channel layer, a barrier layer, and an insulator layer sequentially formed on a substrate. The substrate, the buffer layer, the channel layer, the barrier layer, and the insulator layer can be the substrate layer 110, the buffer layer 112, the channel layer 114, the barrier layer 116, and the insulator layer 118 of FIG. 1, respectively.

The process 300 can begin with the step of forming an etch mask layer on top of the insulator layer (step 301). In some examples, a first $Si_xN_y$ layer grown by MOCVD is used as the insulator layer, and a second $Si_xN_y$ layer grown by PECVD is used as the etch mask layer. Due to different properties (e.g., density) of the films grown by the two different methods, the etch mask layer and the insulator layer can be each be etched by methods that do not substantially etch the other layer. For example, the $Si_xN_y$ layer formed by PECVD can be etched by a suitable wet chemical etching technique (e.g., by using a heated phosphoric acid solution), while the $Si_xN_y$ layer formed by MOCVD can be resistant to the same wet chemical etching technique. As such, after the etch mask layer is formed, an opening is formed in the etch mask layer for defining a trench through the underlying material. The opening can be formed, for example, by etching the etch mask layer using a heated phosphoric acid solution. Forming the opening in the etch mask layer can result in the sidewalls of the opening being slanted, as illustrated in etch mask layer 326 and insulator layer 318 in structure configuration 352 of FIG. 3B, in particular when wet etching is used to define the opening.

Next, the etch mask layer is used as a mask for removing part of the insulator layer beneath the opening to form a trench in the insulator layer (step 302). The step 302 can use any suitable etch technique to remove the part of the insulator layer. In a particular example, dry etching such as reactive-ion etching (RIE) in a gas ambient including $SF_6$ is used to etch the $Si_xN_y$ in both the etch mask and the insulator layers, thereby patterning at least part of the trench and exposing the barrier layer.

Due to high etch selectivity between the insulator layer 318 (e.g., a $Si_xN_y$ layer) and the barrier layer 316 (e.g., an $Al_xGa_{1-x}N$ layer), the dry etching may stop on a top surface of the barrier layer, as illustrated in structure configuration 352 of FIG. 3B. Because the opening in the etch mask layer 326 is formed having slanted sidewalls, the resulting trench that is etched through the insulator layer can also have slanted sidewalls.

The trench is then extended into the III-N materials by removing part of the barrier layer 316 (step 304). The part of the barrier layer that is removed in order to extend the trench into the III-N materials can be removed by dry etching, e.g., by using RIE etching in a gas ambient including $Cl_2$ instead of $SF_6$ (which was used for the insulator layer). The etching depth into the barrier layer can be controlled, e.g., by controlling etching rate and/or etching time, such that the remaining barrier layer has a particular thickness away from a top surface of the channel layer, as illustrated in structure configuration 354 of FIG. 3B. The remaining portion of the barrier layer 316 in the region in which the trench is being formed can be subsequently removed by an annealing process (step 306) followed by a wet etching process (step 308), as discussed in further detail below.

As noted above, after the trench is extended into the III-N materials by dry etching part of the barrier layer 316, a portion of the barrier layer remains beneath the trench, the remaining portion being thinner than the original thickness of the barrier layer (the original thickness being the same as the thickness of the barrier layer on either side of the trench). The remaining portion of the barrier layer in the trench region is then removed in order to extend the trench to the upper surface of the III-N channel layer 314. The following process may be used to remove the remaining portion of the III-N barrier layer without etching the III-N channel layer.

After extending the trench into the III-N materials by dry etching part of the barrier layer, the III-N device is annealed in a gas ambient including oxygen at an elevated temperature (step 306). As noted above, the channel layer can be a III-N layer which does not contain aluminum (Al) as one of the group-III elements (e.g., the channel layer can be a GaN layer). The barrier layer can be a III-N layer which includes Al as one of the group-III elements (e.g., the barrier layer can be an $Al_xGa_{1-x}N$ layer). The annealing process can selectively oxidize the Al-containing barrier layer, without oxidizing the channel layer, as the channel layer can be resistive to oxidization due to the lack of aluminum in the layer. Referring to the structure configuration 356 of FIG. 3B, the oxidized region of the barrier layer 316 is indicated by a shaded region 362 that stops at the top surface of the channel layer 314.

The elevated temperature for annealing, as well as the remaining thickness of the barrier layer in the trench region prior to annealing, are critical parameter for high selectivity of etching between the oxidized barrier layer and the un-oxidized channel layer. The elevated annealing temperature is typically within a temperature range from about 300° C. to 700° C. In a particularly example, the elevated annealing temperature is about 500° C. In some cases, if the anneal temperature is too high, for example higher than 700° C., the channel layer will also be partially oxidized and will be etched away during the subsequent etching process, which will render the device inoperable. On the other hand, if the anneal temperature is too low, then the remaining barrier layer in the trench region may not be completely oxidized during the anneal process, which could also render the device inoperable.

In order for the trench to be etched precisely to the upper surface of the channel layer, it can also be important to ensure that, after dry etching of the barrier layer, the remaining barrier layer has a particular thickness that is within a predetermined thickness range. For example, if the initial thickness of the barrier layer prior to etching is about 30 nm, the predetermined thickness range to which the barrier layer is etched to in the trench region prior to the oxidation step can be between about 3 nm and 10 nm.

If the remaining thickness of the barrier layer prior to oxidation is smaller than the minimum predetermined thickness, e.g., smaller than 3 nm, the dry etching in step 304 can cause ion bombardment damage in the channel layer, thus damaging the device channel and worsening the performance of the device, or possibly rendering the device inoperable. Additionally, when the remaining thickness of the barrier prior to oxidation is too small, the subsequent anneal process can partially oxidize the channel layer, which is undesirable in that it could also render the device inoperable.

If the remaining thickness of the barrier layer prior to oxidation is larger than the maximum predetermined thickness, e.g., larger than 10 nm, the subsequent anneal process may not be able to oxidize all the remaining barrier layer in the trench region, such that the subsequent wet etching process can not completely remove the barrier layer from the top surface of the channel layer in the trench, which may deteriorate device performance of the III-N device.

In some implementations of the process 300, the initial thickness (i.e., the as-grown thickness) of the III-N barrier layer is within the predetermined range for which the oxidation of the III-N barrier layer stops precisely at the upper surface of the III-N channel layer. In this case, the step of dry etching the III-N barrier layer prior to annealing may be omitted, and the anneal can be performed after etching through the thickness of the insulator layer without first etching any of the III-N barrier layer.

After the anneal which oxidizes the portion of the III-N barrier layer in the trench region, the remaining oxidized portion of the barrier layer in the trench region can be removed using wet etching (step 308). The wet etching can be wet chemical etching in an alkaline solution, e.g., KOH solution or TMAH solution. A temperature of the alkaline solution bath can vary from room temperature to 100° C.

As discussed above, during wet chemical etching, alkaline solution can selectively remove the oxidized barrier layer without attacking the un-oxidized channel layer. Therefore, the remaining oxidized barrier layer can be completely removed from above the channel layer in the trench region, and the top surface of the channel layer can be exposed below the trench, as illustrated in the structure configuration 358 of FIG. 3B.

In some examples, as further illustrated in the structure configuration 358 of FIG. 3B, the trench in the barrier layer 316 has vertical sidewalls after wet etching. This is believed to be possibly due to anisotropic oxidation of the III-N barrier layer. It is believed that under the oxidation conditions previously described, the III-N materials oxidized selectively along the direction in which dislocations in the III-N materials exist. Because dislocations are formed along the direction of growth, the oxidation also occurs along the growth direction of the III-N materials, and not in a lateral direction. Hence, as illustrated in structure configuration 356, the interfaces between the oxidized portion of the barrier layer 362 and the non-oxidized portions on either side of the oxidized portion are vertical (or at least substantially more vertical than the slanted sidewalls of the trench along the insulator layer).

After the trench is formed, the etch mask layer 326 can be removed from the III-N device, e.g., by using suitable wet chemical etching technique. As noted above, the etch mask layer can be a $Si_xN_y$ layer formed by PECVD, different from the $Si_xN_y$ insulator layer formed by MOCVD. Therefore, using a suitable wet chemical etch, the etch mask layer can be removed from a top surface of the insulator layer without etching the insulator layer.

As illustrated in structure configuration 360 of FIG. 3B, the III-N device has a trench formed with vertical sidewalls in the barrier layer 316 and slanted sidewalls in the insulator layer 318. The trench extends from the top surface of the channel layer 314, through the barrier layer and the insulator layer to the top surface of the insulator layer. The III-N device can be further processed according to the process 200, e.g., steps 212, 214 and 216, in FIG. 2B to form a III-N device, e.g., a high-voltage III-N enhancement-mode field effect transistor.

Figure 5:
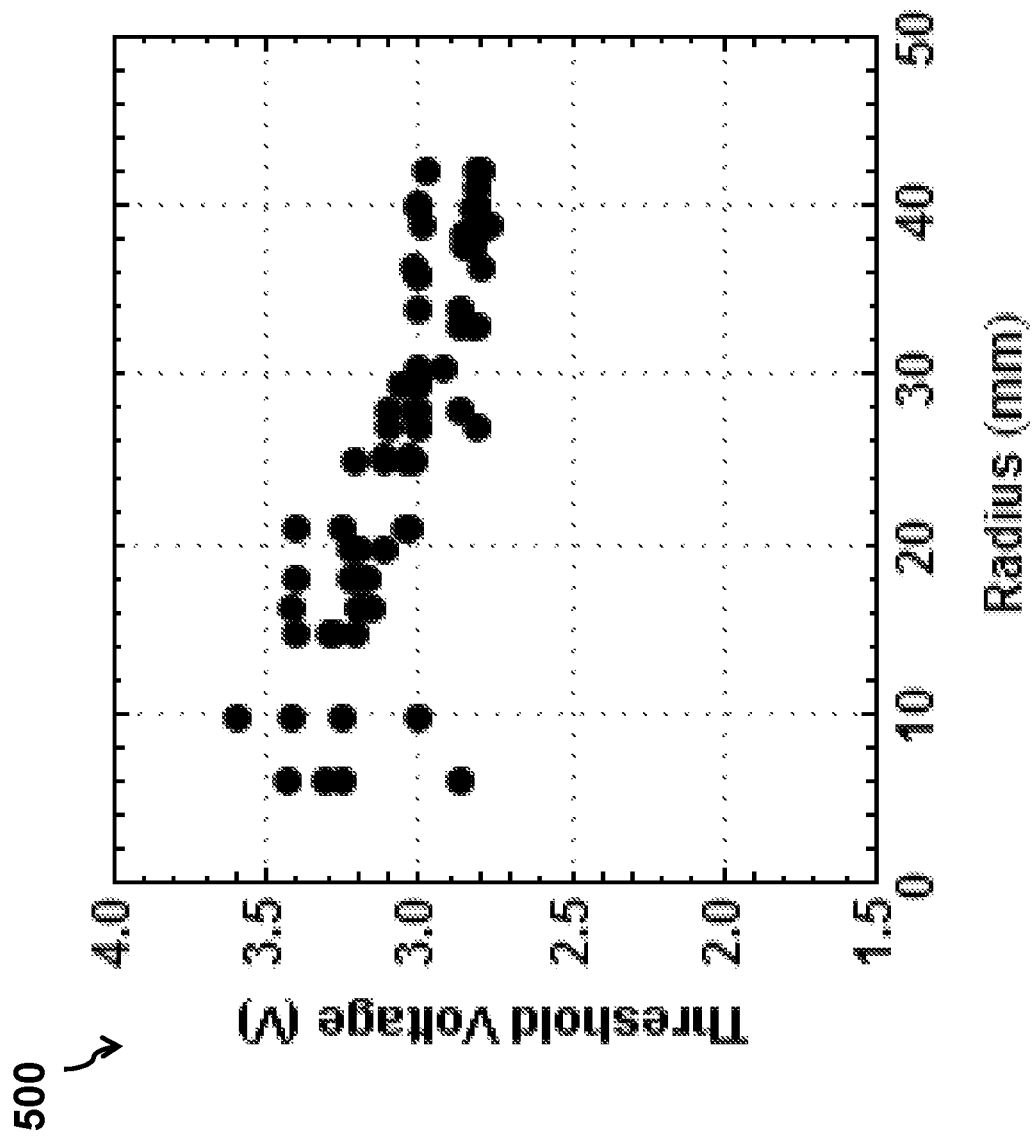
FIG. 5 shows threshold voltage variations of III-N devices formed on a single wafer.

FIG. 5 shows threshold voltages 500 of a set of III-N devices, i.e., a set of high-voltage III-N enhancement-mode field effect transistors, which were all formed on the same 4-inch wafer using the processes described above, such that they each had the structure illustrated in FIG. 1 The threshold voltages of the III-N devices across the 4-inch wafer are plotted as a function of the distance of the device from the center of the wafer.

It is shown that the threshold voltage of the formed III-N devices are all above 2.5 V, with a threshold voltage variation of no more than about 0.7 V across the entire wafer. Since the techniques can accurately control the etch depth of the barrier layer in the trench, e.g., by removing the barrier layer with wet chemical etching and ending up on top of the channel layer without ion bombardment damage on the channel layer, the channel electron mobility and interface quality after the gate insulator deposited on the top of the channel layer is quite uniform across the wafer, which ensures high manufacturing productivity and repeatability.

Figure 6:
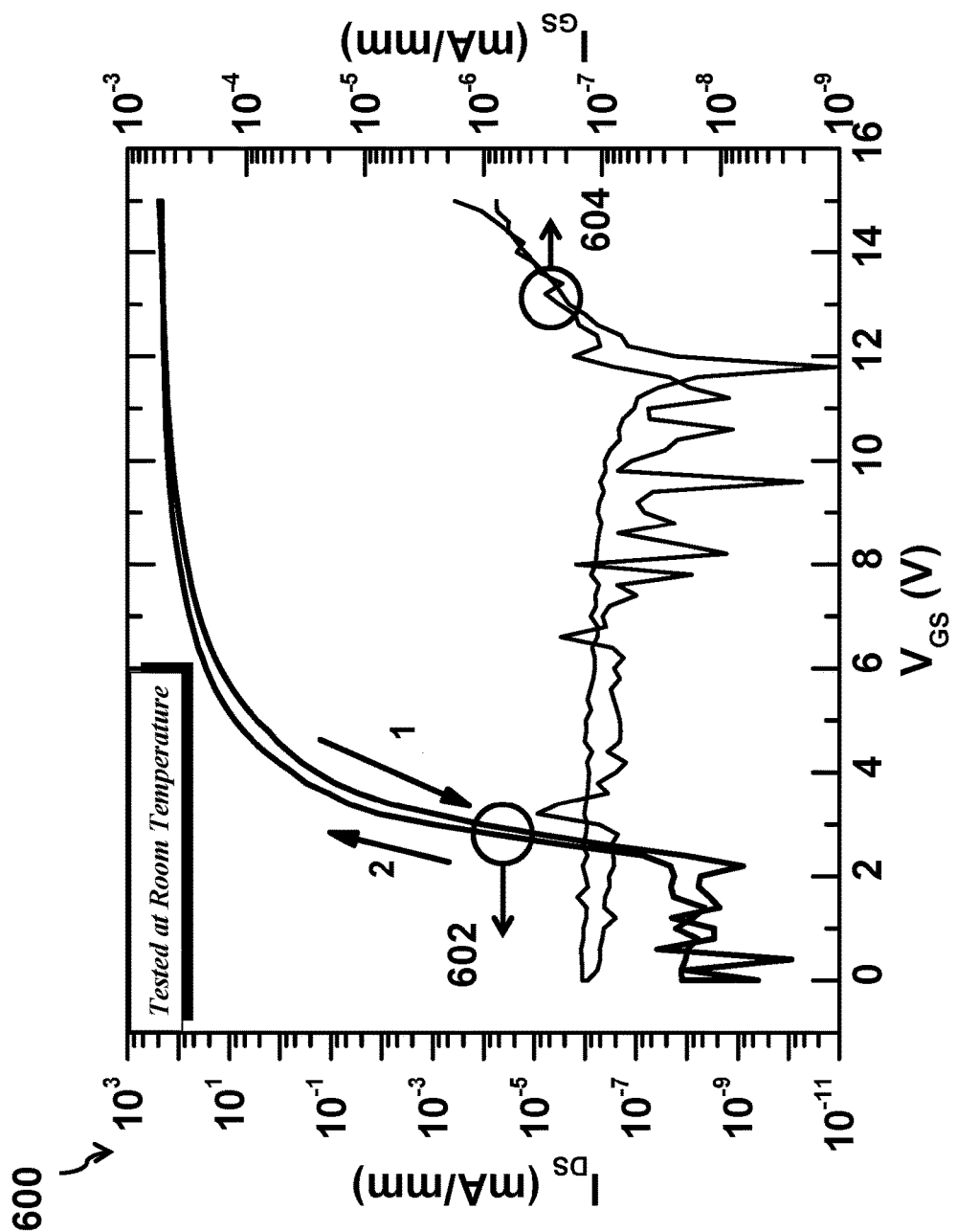
FIG. 6 shows characteristics of a III-N device with an amorphous $Al_xSi_yN$ film as a gate insulator at room temperature.

FIG. 6 shows transfer curves 600 (in log scale) of a III-N device with an amorphous $Al_xSi_yN$ film as a gate insulator at room temperature, e.g., at about 300 K. The III-N device has the structure of the III-N device 100 of FIG. 1, and was formed by techniques described above in the process 200 of FIGS. 2A-2B and the process 300 of FIGS. 3A-3B. As curve 602 shows, the transistor demonstrates enhancement-mode characteristics with a threshold voltage $V_{Th}$ more than 2 V (the threshold voltage is the gate-source voltage $V_{GS}$ at which the current begins to rise, indicating that the device is turning on). The threshold voltage hysteresis between the positive direction sweep (2) and the negative direction sweep (1) is less than 0.5 V, which indicates low density of interface traps. As curve 604 shows, an ON-state drain current density IDs is around 250 mA/mm. An OFF-state drain leakage current density IDS is about $10^{-8}$ mA/mm and the gate leakage current $I_{GS}$ is about $10^{-6}$ mA/mm.

Figure 7:
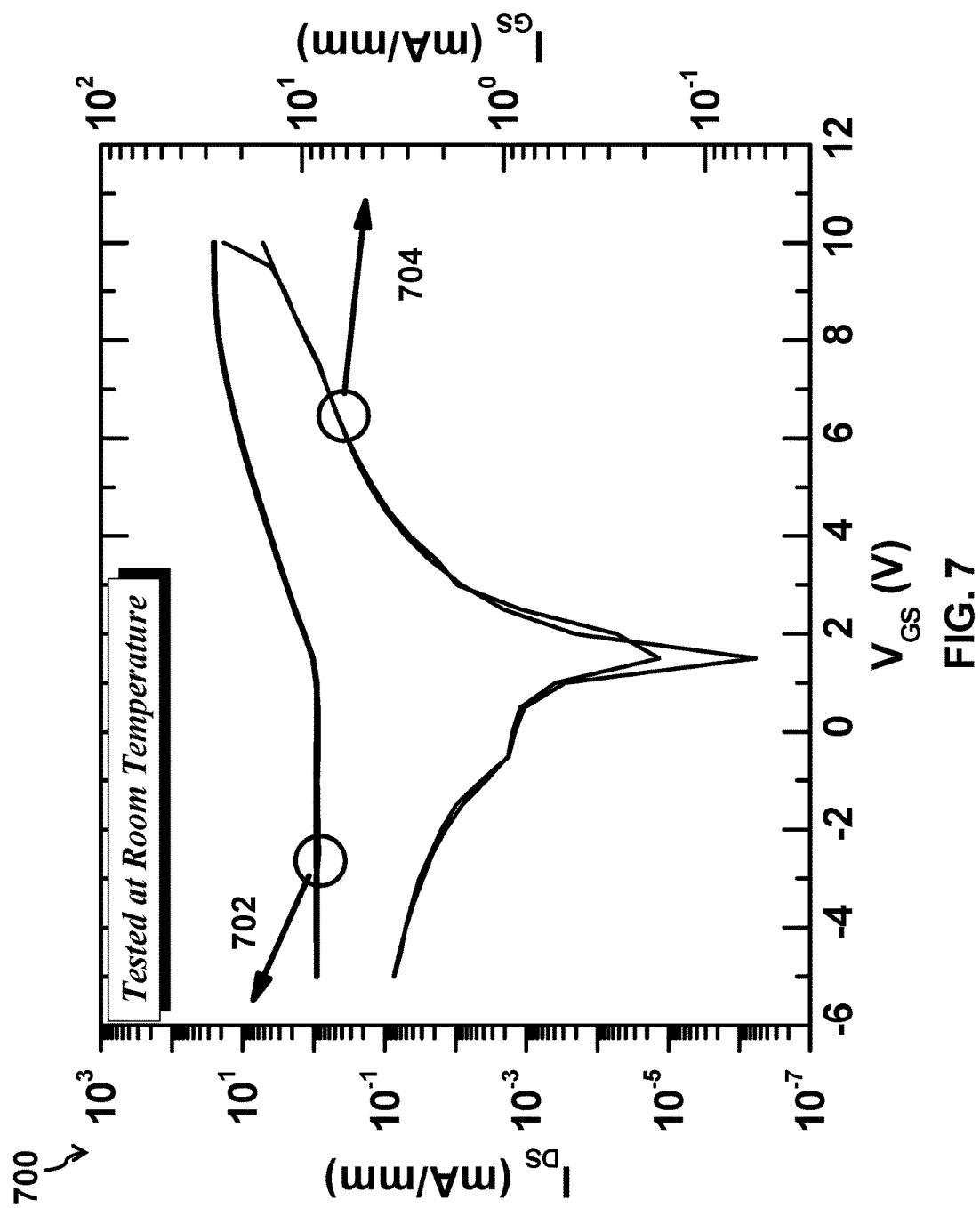
FIG. 7 shows characteristics of a III-N device with a polycrystalline $Al_xSi_yN$ film as a gate insulator at room temperature.

FIG. 7 shows transfer curves 700 (in log scale) of a III-N device (field effect transistor) with a polycrystalline $Al_xSi_yN$ film as a gate insulator at room temperature. As discussed above, with polycrystalline $Al_xSi_yN$, the transistor cannot be fully turned off because of high gate current leakage. As curve 704 shows, the gate leakage current is more than 10 mA/mm. As curve 702 shows, the transistor has a threshold voltage of about 1 V, and the drain current density is about 10 mA/mm at ON-state and 5 mA/mm at OFF-state. The gate electrode of the transistor may be easily broken down under low gate bias. As shown in FIG. 7, the gate leakage current of the device with the polycrystalline $Al_xSi_yN$ film as a gate insulator when the device was biased at a gate-source voltage of 0V was about 1 mA/mm, while the gate-leakage current of the devices with amorphous $Al_xSi_yN$ gate insulator films was less than $10^{-6}$ mA/mm under the same bias conditions (as can be seen in FIG. 6). Hence, off state gate leakage currents in devices with amorphous $Al_xSi_yN$ gate insulator films were found to be about 6 orders of magnitude lower than those in devices which had polycrystalline $Al_xSi_yN$ gate insulator films but were otherwise identical.

Measurements in FIGS. 6 and 7 indicate that the III-N device with an amorphous $Al_xSi_yN$ film as a gate insulator can achieve much better device performance, e.g., higher threshold voltage and lower leakage, than a III-N device with a polycrystalline $Al_xSi_yN$ film as a gate insulator.

Figure 8:
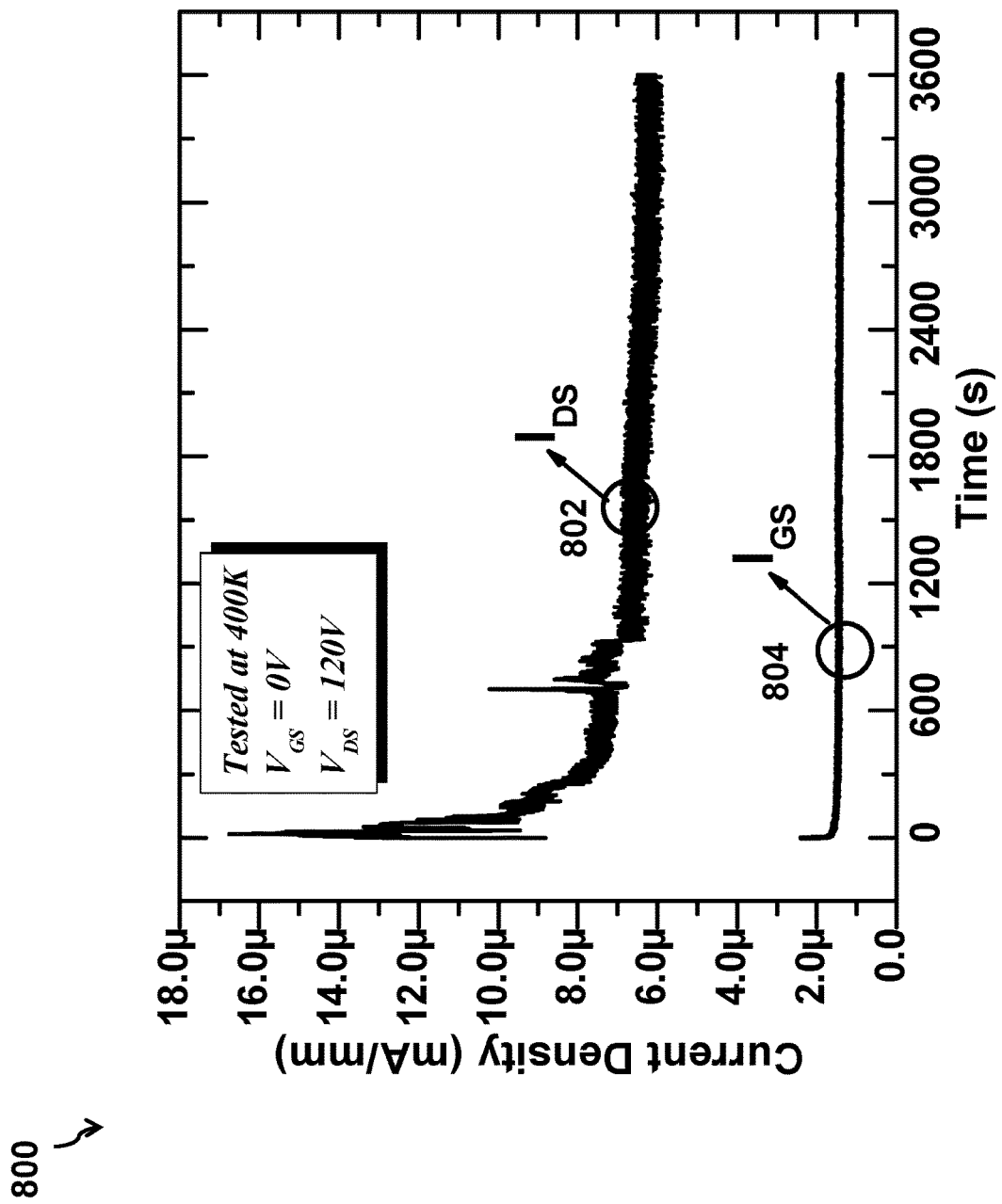
FIG. 8 shows OFF-state characteristics of the III-N device of FIG. 1 at an elevated temperature over a period of time.

FIG. 8 shows OFF-state characteristics 800 of a III-N device at an elevated temperature over a period of time. The III-N device had the structure of the III-N device 100 of FIG. 1, with an amorphous $Al_xSi_yN$ film as a gate insulator, and was formed by techniques described above in the process 200 of FIGS. 2A-2B and the process 300 of FIGS. 3A-3B.

The III-N device was tested at OFF-state, with zero volt gate bias (e.g., $V_{GS}$=0 V) and 120 V drain bias (e.g., $V_{DS}$=120V) applied to the III-N device. The elevated temperature was about 400 K. Curves 802 and 804 show the OFF-state drain leakage current density and gate leakage current density stability, respectively, under the condition of high temperature (400K) drain bias stress for 1 hour. It is shown that the gate leakage current density $I_{GS}$, as well as the drain leakage current density IDS, stayed stable without obvious variations. This level of stability is substantially better than any that have been achieved with other materials for the gate insulator layer.

Figure 9:
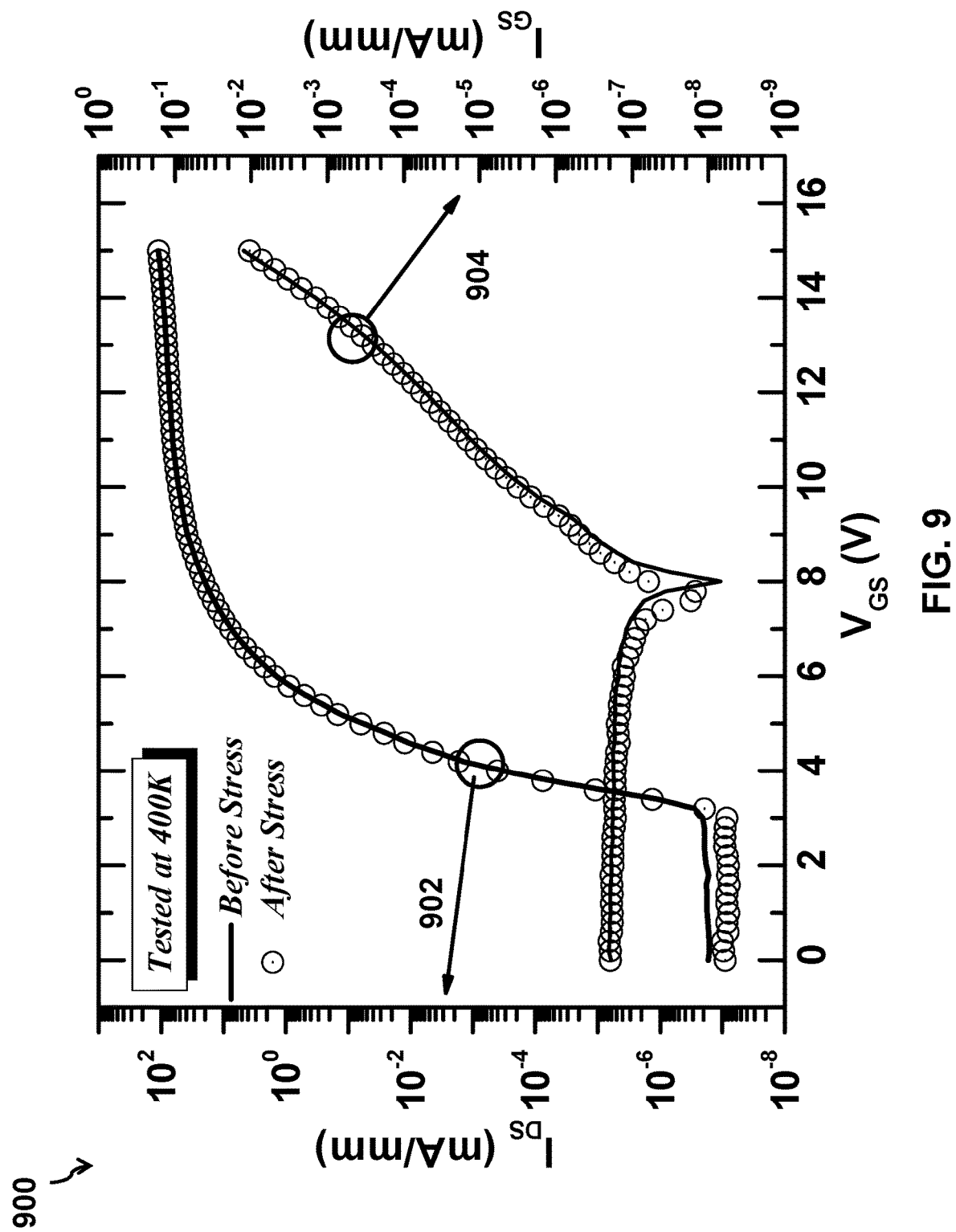
FIG. 9 shows characteristics of the III-N device of FIG. 1 before and after being subjected to an elevated temperature.

FIG. 9 shows transfer curves 900 (in log scale) of a III-N device having an amorphous $Al_xSi_yN$ film as a gate insulator before and after high temperature stress. The III-N device has the structure of the III-N device 100 of FIG. 1, and was formed by techniques described above in the process 200 of FIGS. 2A-2B and the process 300 of FIGS. 3A-3B. The III-N device tested for the measurements of FIG. 9 was the same device tested for the measurements of FIG. 6.

Curves 902 and 904 show that the drain current density and the gate current density before and after the device was held at a high temperature of 400 K. It is shown that there is no obvious change observed after the high temperature stress. Additionally, as curve 902 shows, the threshold voltage of the III-N device is about 3 V, the ON-state drain current density is about 100 mA/mm at ON-state, and the OFF-state drain leakage current density is about 10^-7 mA/mm. As curve 904 shows, the OFF-state gate leakage current density is less than 10^-6 mA/mm (it is about 10^-7 mA/mm). Compared to measurement results at room temperature at about 300 K in FIG. 6, the performance of the III-N device does not change significantly with the high temperature drain bias stress.

Figure 10:
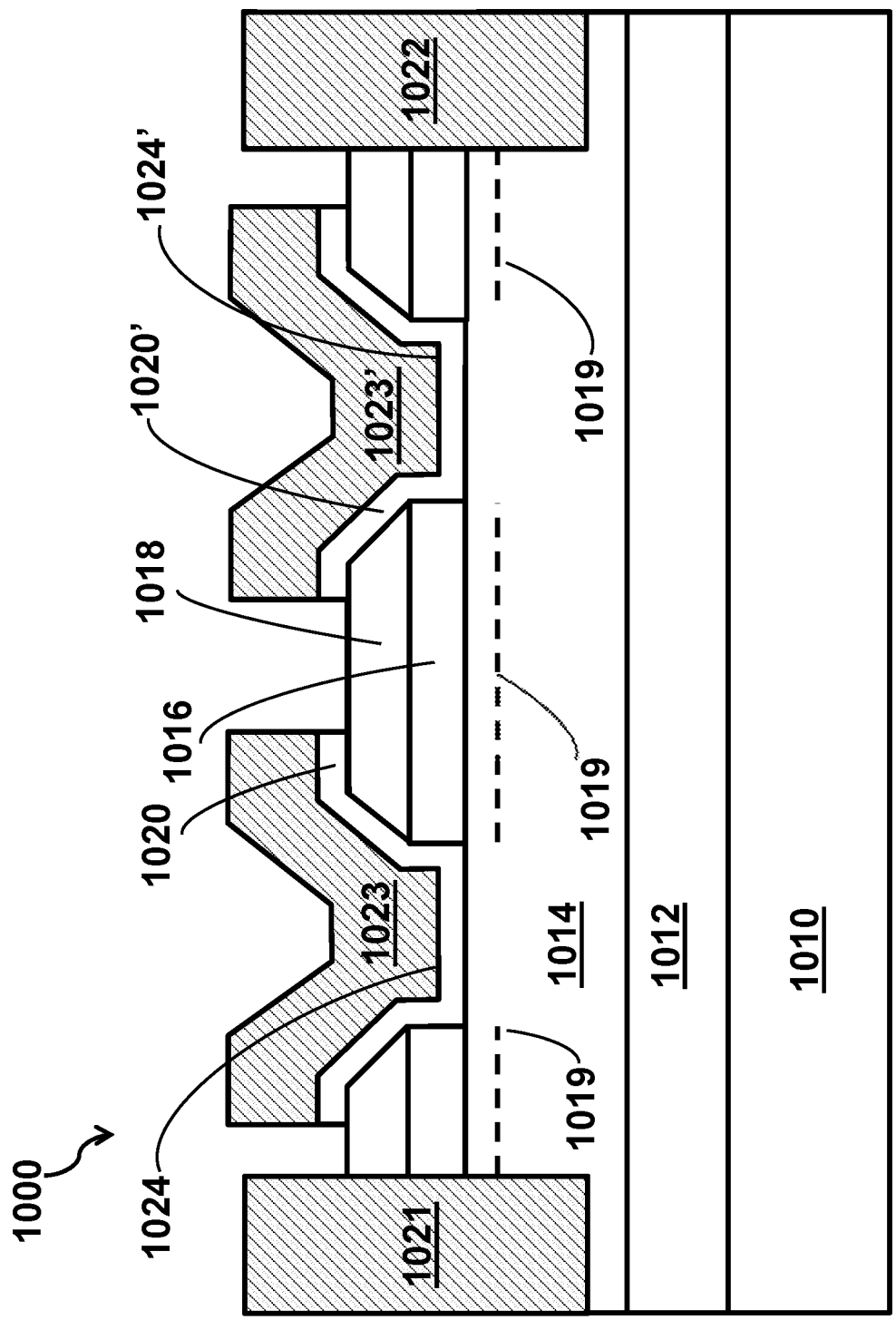
FIG. 10 is a cross-sectional view of another example III-N device.

FIG. 10 is a cross-sectional view of another III-N device 1000. Device 1000 is similar to device 100 of FIG. 1, except that device 1000 includes two gate electrodes 1023 and 1023' between the power electrodes 1021 and 1022. Device 1000 can be operated as a bidirectional switch (i.e., a four quadrant switch or FQS), where voltages on the first gate electrode 1023 are applied relative to the first power electrode 1021, voltages on the second gate electrode 1023' are applied relative to the second power electrode 1022, and power electrodes 1021 and 1022 are each operated as a source and a drain of the device 1000 (depending on the polarity of the voltage across the device and/or the direction of current flow).

Layers 1010, 1012, 1014, 1016, and 1018 of device 1000 each have the same properties as respective layers 110, 112, 114, 116, and 118 of the device of FIG. 1, and can therefore be the same materials and formed using the same methods previously described with reference to device 100 of FIG. 1. Trenches 1024 and 1024' can each have the same shape and properties as trench 124 in FIG. 1, and can be formed by the same methods as those described with reference to device 100 of FIG. 1. Gate electrodes 1023 and 1023', as well as their respective gate insulator layers 1020 and 1020', can each have the same shape and properties as gate insulator layers 120 in FIG. 1, and can be formed by the same methods and/or from the same materials as those described with reference to device 100 of FIG. 1.

Figure 11E:
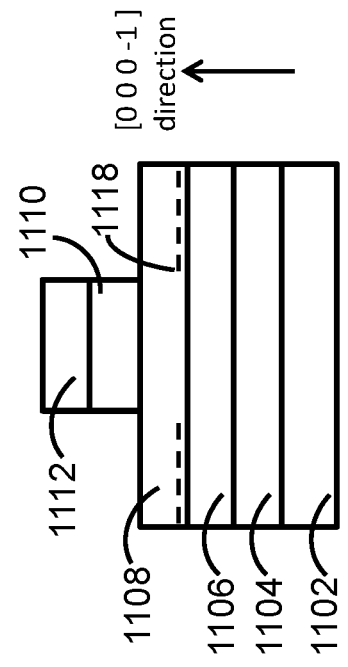
Figure 11F:
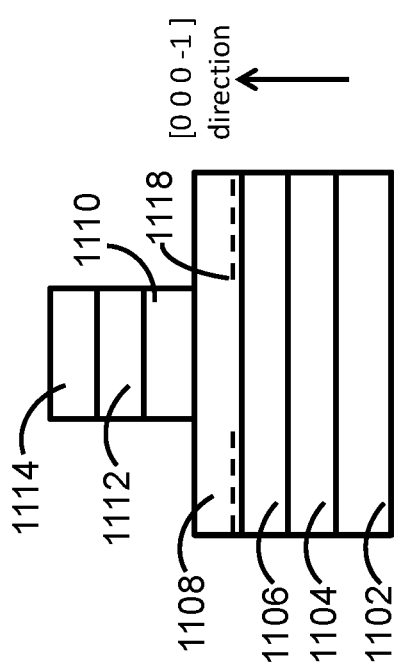
Figure 11G:
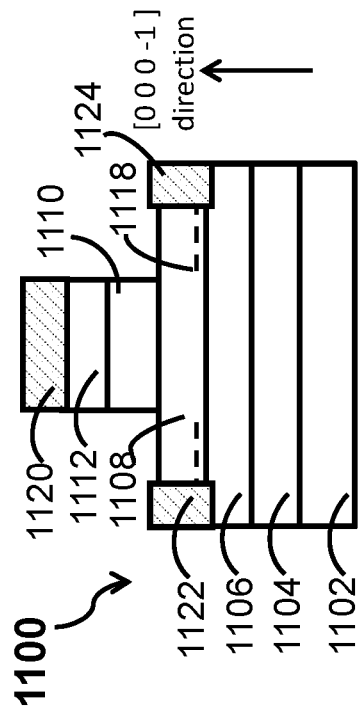
FIG. 11G is a cross-sectional view of an N-polar III-N device.

A III-N device 1100, e.g., a nitrogen polar (N-polar) enhancement-mode III-N transistor, in which the III-N materials are formed in a nitrogen polar (i.e., N-polar) orientation is illustrated in FIG. 11G The device 1100 includes a series of III-N layers 1104, 1106, 1108, and 1110 formed in an N-polar or [0 0 0 −1] orientation on a substrate 1102, which can for example be a silicon substrate. That is, the N-face or [0 0 0 −1] face of the III-N material structure is on an opposite side of the III-N material structure from the substrate 1102.

III-N layer 1104 is a buffer layer formed of a material such as GaN, AlGaN, or combinations thereof. III-N layer 1106 is a first barrier layer formed of a material such as AlGaN, AlInN, or AlInGaN, III-N layer 1108 is a channel layer formed of a material such as GaN, and III-N layer 1110 is a second barrier layer formed of a material such as AlGaN, AlInN, or AlInGaN. The first barrier layer 1106 has a larger bandgap than the channel layer 1108, such that a conductive channel 1118 (e.g., a 2DEG channel) is induced in the channel layer 1108 adjacent to the interface between the channel layer 1108 and the first barrier layer 1106. The second barrier layer 1110 is over the channel layer 1108 in the gate region of the device (i.e., directly beneath the gate electrode 1120) but not over the channel layer 1108 in the device access regions on opposite sides of the gate region. The second barrier layer 1110 has a larger bandgap than the channel layer, and is sufficiently thick (e.g., at least 2 nm or at least 5 nm thick) to ensure that mobile charge is depleted from the 2DEG in the gate region of the device when 0V is applied to the gate electrode 1120 relative to the source contact 1122, but that the 2DEG is populated with mobile charge in the gate region when a sufficiently high positive voltage is applied to the gate electrode 1120 relative to the source contact 1122.

Gate insulator layer 1112, which may optionally be omitted, is disposed between the gate electrode 1120 and the second III-N barrier layer 1110. Gate insulator layer can be formed of $Al_xSi_yN$, $Si_xN_y$, or the like. Source and drain contacts 1122 and 1124, respectively, electrically contact the conductive channel 1118. The source contact 1122, the drain contact 1124, and/or the gate contact 1120 are over an N-face of the III-N material structure.

A method of fabricating III-N device 1100 is illustrated in FIGS. 11A-11G First, as illustrated in FIG. 11A, layers 1104, 1106, 1108, 1110, and 1112 are grown or deposited sequentially on the substrate. In some implementations, layers 1104, 1106, 1108, 1110, and 1112 are all grown by MOCVD. In some implementations, only layers 1104, 1106, 1108, and 1110 are grown, and layer 1112 is omitted from the structure. Next, as shown in FIG. 11B, a mask layer 1114, which can for example be $Si_xN_y$, deposited by sputtering or PECVD, is deposited over the gate region of the device. In implementations where the gate insulator layer 1112 is included, the mask layer 1114 is then used as an etch mask for etching away the gate insulator layer 1112 on either side of the gate region (i.e., over the contact and access regions of the device), as shown in FIG. 11C. For example, the gate insulator layer 1112 on either side of the gate region can be removed by dry etching using an etch chemistry that selectively etches the material of the gate insulator layer 1112 without etching the material of the second barrier layer 1110.

Next, as shown in FIG. 11D, the device is annealed in a gas ambient including oxygen at an elevated temperature in order to oxidize the exposed portions of the second barrier layer 1110' on either side of the gate region of the device, while the III-N material masked by the mask layer 1114 is not oxidized. As with other devices described herein, the second barrier layer 1110 can be formed of a III-N material which includes Al as one of the group-III elements (e.g., AlGaN, AlInN, or AlGaInN), while the channel layer 1108 can be formed of a III-N material which is substantially free of Al (e.g., GaN), such that the oxidation step causes all of the exposed second barrier layer material to be oxidized without oxidizing the channel layer 1108. In this case, as before, the oxidation stops precisely on the upper surface of the channel layer 1108. In some implementations, the second barrier layer 1110 has a thickness within the predetermined range that allows for the oxidation to stop precisely on the upper surface of the channel layer 1108, e.g., in the range of 3 nm to 10 nm. Although not shown in FIG. 11D, in cases where the second barrier layer 1110 is thicker than the maximum thickness of the predetermined range, the second barrier layer 1110 may be partially removed, for example by dry etching, prior to the oxidation step.

Referring to FIG. 11E, the oxidized portions 1110' of the second barrier layer are then removed, for example using the wet etching process previously described, in order to expose an N-face of the channel layer 1108 and cause the 2DEG channel 1118 to be induced in the channel layer 1108 adjacent to the first barrier layer 1106 in the device access regions. Next, as shown in FIG. 11F, the etch mask 1114 is removed. Finally, as shown in FIG. 11G the gate electrode 1120 is formed over the gate region of the device, and the source and drain contacts 1122 and 1124, respectively, are formed on opposite sides of the gate electrode 1120.

Figure 12F:
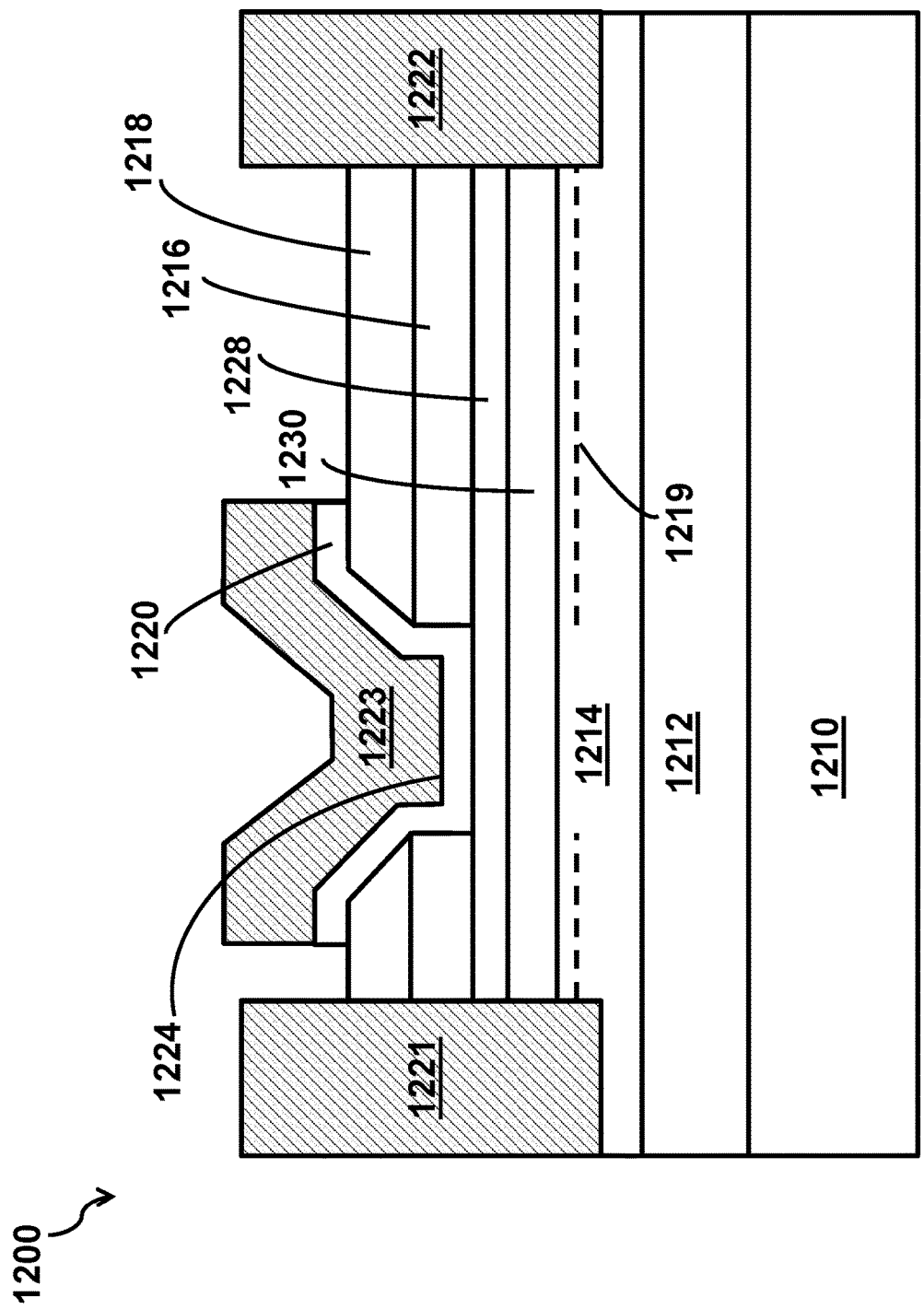

A III-N device 1200 which is similar to that of FIG. 1 but also includes an etch stop layer and a second barrier layer is illustrated in FIG. 12F. The device 1200 includes a series of III-N layers 1212, 1214, 1230, 1228, and 1216 formed on a substrate 1210, which can for example be a silicon substrate. III-N layer 1212 is a buffer layer formed of a material such as GaN, AlGaN, or combinations thereof. III-N layer 1214 is a channel layer formed of a material such as GaN. III-N layer 1216 is a first barrier layer formed of a material such as AlGaN, AlInN, or AlInGaN. III-N layer 1228, which is directly below the first barrier layer 1216, is an etch stop layer formed of a material such as GaN. III-N layer 1230, which is between the channel layer 1214 and the etch stop layer 1228, is a second barrier layer formed of a material such as AlGaN, AlInN, or AlInGaN. Layer 1218 is an insulator layer formed of silicon nitride or the like.

As seen in FIG. 12F, device 1200 can be formed as an enhancement-mode device. That is, as further described below, the thicknesses and compositions of III-N layers 1230, 1228, and 1216 can be selected such that when 0V is applied to the gate 1223 relative to the source 1221, a conductive 2DEG channel 1219 is induced in the channel layer 1214 in the device access regions (i.e., between the source 1221 and the gate 1223 and between the drain 1222 and the gate 1223) but not in the device gate region (i.e., beneath the gate). When a voltage greater than the device threshold voltage, which for an enhancement-mode device is greater than 0V, is applied to the gate 1223 relative to the source 1221, the 2DEG channel 1219 is also induced in the device gate region in the channel layer 1214, so that the conductive channel 1219 extends all the way from the source 1221 to the drain 1222.

As further illustrated in FIG. 12F, the second barrier layer 1230 and the etch stop layer 1228 are both formed beneath the gate in the gate region of the device, but the first barrier layer 1216 is not in the gate region (e.g., directly between the gate and the portion of the channel that is modulated by the gate) of the device. The first barrier layer is only included over the device access regions on either side of the gate region. In order to ensure that 2DEG channel 1214 is depleted of charge in the gate region when 0V is applied to the gate 1223 relative to the source 1221, the second barrier layer can be made thin, for example between 0.1 nanometers and 3 nanometers or between 0.1 nanometers and 2 nanometers, and can have an aluminum composition that is less than 0.4 or less than 0.3. Forming barrier layer 1230 too thick and/or with too high an aluminum composition can cause the 2DEG 1219 to be formed in the gate region when 0V is applied to the gate relative to the drain, which would result in device 1200 being a depletion-mode device.

In order to ensure that 2DEG channel 1219 is induced in the access regions at all times, the first barrier layer 1216 can be formed sufficiently thick and with a sufficiently high aluminum concentration. For example, the first barrier layer can be thicker than 20 nanometers, for example between 20 and 50 nanometers, and have an aluminum composition greater than 0.2, for example between 0.2 and 0.5. The first barrier layer may also optionally be doped n-type.

As described in more detail below, gate 1223 is formed in a trench 1224 which is etched through the entire thickness of the first barrier layer 1216. Etch stop layer 1228 is included to ensure precision in the depth that the trench is etched. In order to effectively function as an etch stop layer, layer 1228 cannot be made too thin. However, having etch stop layer too thick can degrade the performance of the device. As such, the etch stop layer typically has a thickness of greater than 0.5 nanometers, and is more typically formed to a thickness in the range of 1 nanometer to 5 nanometers or 1 nanometer to 3 nanometers.

Insulator layer 1218 is deposited on the first barrier layer 1216 and can be formed of $Si_xN_y$ or the like. A gate insulator 1220, e.g., a gate insulator layer or a gate dielectric layer, is grown or deposited conformally at least partially in the trench 1224 and can be formed of $Al_xSi_yN$, $Si_xN_y$, or the like. The gate insulator 1220 can be on the top surface of the etch stop layer 1228 in the gate region of the device. The gate insulator 1220 can extend at least from the top surface of the etch stop layer 1228 to the top surface of the insulator layer 1218. The gate insulator 1220 can also have vertical sidewalls in the barrier layer 1216 and slanted sidewalls in the insulator layer 1218. The gate electrode 1223 is deposited on the gate insulator 1220. The source and drain contacts 1221 and 1222, respectively, electrically contact the conductive channel 1219.

A method of fabricating III-N device 1200 is illustrated in FIGS. 12A-12F. First, as illustrated in FIG. 12A, layers 1212, 1214, 1230, 1228, 1216, and 1218 are grown or deposited sequentially on the substrate 1210. In some implementations, layers 1212, 1214, 1230, 1228, 1216, and 1218 are all grown by MOCVD. A mask layer 1226, which can for example be $Si_xN_y$, deposited by sputtering or PECVD, is deposited over the insulator layer 1218. The mask 1226 and insulator 1218 are dry etched in a gate region of the device, and a trench 1224 is formed to a top surface of the first barrier layer 1216. Next, as shown in FIG. 12B, a portion of the first barrier layer 1216 is dry etched away, extending the trench 1224 part way through the first barrier layer.

The device is then annealed in a gas ambient including oxygen at an elevated temperature in order to oxidize the exposed portions of the first barrier layer 1216 while the III-N material masked by the mask layer 1226 is not oxidized, as shown in FIG. 12C. As with other devices described herein, the first barrier layer 1216 can be formed of a M-N material which includes Al as one of the group-III elements (e.g., AlGaN, AlInN, or AlGaInN), while etch stop layer 1228 can be formed of a III-N material which is substantially free of Al (e.g., GaN), such that the oxidation step causes all of the exposed first barrier layer material to be oxidized, indicated by 1262, without oxidizing the etch stop layer 1228. In some implementations, after the trench 1224 is etched part way through the first barrier layer 1216 but prior to the oxidation step, the first barrier layer 1216 has a thickness beneath the trench 1224 that is within the predetermined range that allows for the oxidation to stop precisely on the upper surface of the etch stop layer 1228, e.g., in the range of 3 nm to 10 nm. In other implementations, the oxidation step is performed without the trench being etched into the first barrier layer 1216, so that the first barrier layer 1216 has the same thickness inside and outside the trench region prior to oxidation, and this entire thickness of the first barrier layer 1216 in the trench region is oxidized. Additionally, in some implementations, the second barrier layer 1230 is partially oxidized via diffusion through the etch stop layer 1228, which can occur in cases where the etch stop layer 1228 is made very thin.

Next, as illustrated in FIG. 12D, the oxidized portions 1262 of the first barrier layer are removed, for example using the wet etching process previously described, thereby extending the trench 1224 through the remainder of the first barrier layer 1216 to the upper surface of the etch stop layer 1228. Then, as illustrated in FIG. 12E, mask layer 1226 is removed. Finally, as shown in FIG. 12F, source and drain contacts 1221 and 1222, respectively, are formed on opposite sides of the trench 1224, the gate insulator layer 1220 is formed in the trench 1224 in the gate region of the device, and the gate electrode 1223 is formed over the gate insulator 1220.

Figure 13:
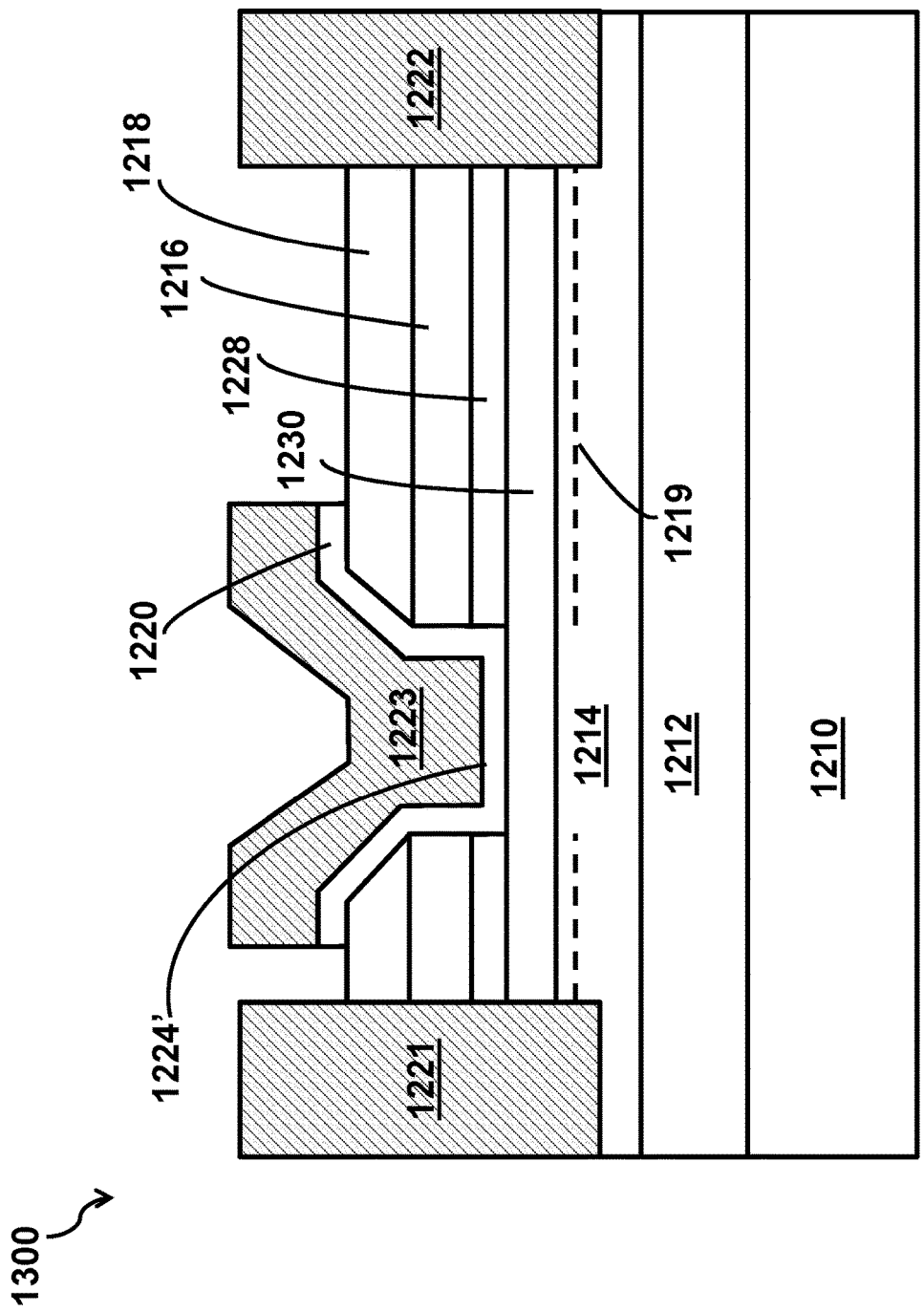
FIG. 13 is a cross-sectional view of another example III-N device.

Prior to deposition of the gate insulator layer 1220 and the gate electrode 1223, the etch stop layer 1228 may optionally also be etched away in the gate region of the device, thereby extending the trench 1224 (labeled 1224' in FIG. 13) to the upper surface of the second barrier layer 1230. The resulting structure 1300 is shown in FIG. 13.

Figure 14C:
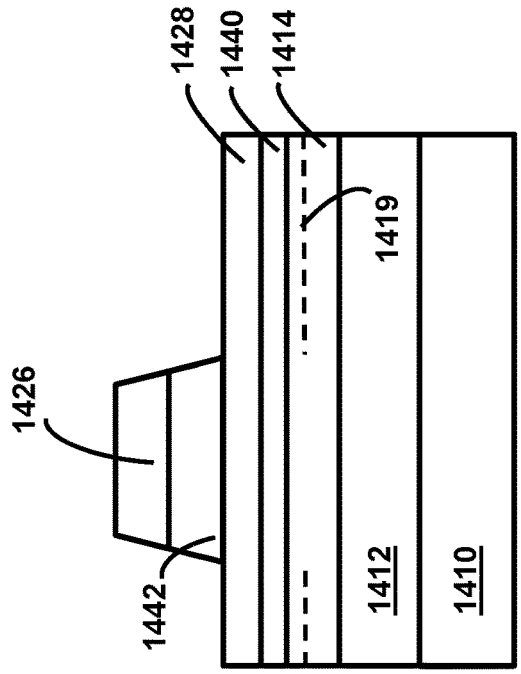
Figure 14D:
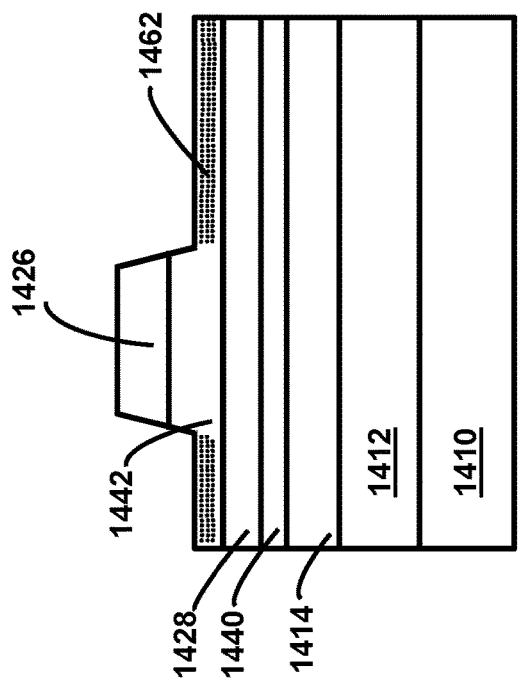
Figure 14E:
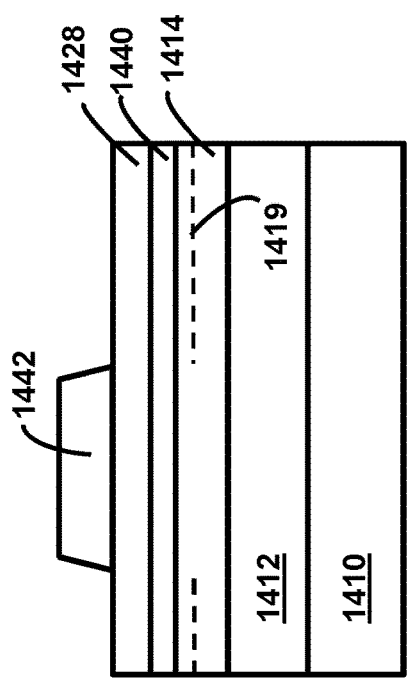
Figure 14F:
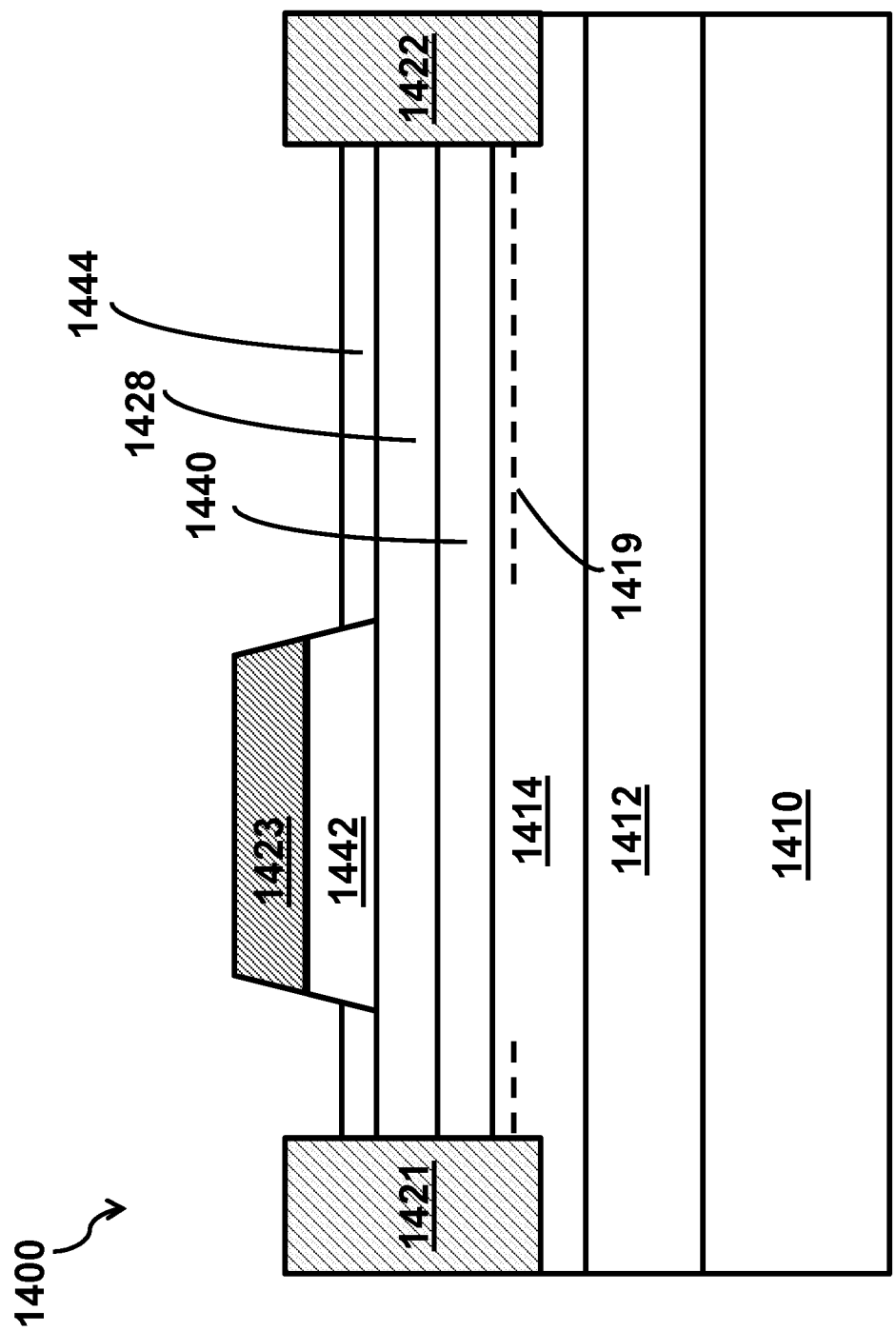

Another III-N device 1400 is illustrated in FIG. 14F. The device 1400 includes a series of III-N layers 1412, 1414, 1440, 1428, and 1442 formed on a substrate 1410, which can for example be a silicon substrate. III-N layer 1412 is a buffer layer formed of a material such as GaN, AlGaN, or combinations thereof. III-N layer 1414 is a channel layer formed of a material such as GaN. III-N layer 1440 is a barrier layer formed of a material such as AlGaN, AlInN, or AlInGaN. III-N layer 1428, which is directly above the barrier layer 1440, is an etch stop layer formed of a material such as GaN. III-N layer 1442, which is above the etch stop layer 1428, is doped p-type and formed of a material such as p-AlGaN. Layer 1444 is an insulator or passivation layer formed of silicon nitride or the like.

As seen in FIG. 14F, device 1400 can be formed as an enhancement-mode device. That is, as further described below, the thicknesses and compositions of III-N layers 1440 and 1428 can be selected such that when 0V is applied to the gate 1423 relative to the source 1421, a conductive 2DEG channel 1419 is induced in the channel layer 1414 in the device access regions (i.e., between the source 1421 and the gate 1423 and between the drain 1422 and the gate 1423) but not in the device gate region (i.e., beneath the gate 1423). When a voltage greater than the device threshold voltage, which for an enhancement-mode device is greater than 0V, is applied to the gate 1423 relative to the source 1421, the 2DEG channel 1419 is also induced in the device gate region in the channel layer 1414, so that the conductive channel 1419 extends all the way from the source 1421 to the drain 1422.

As further illustrated in FIG. 14F, the barrier layer 1440 and the etch stop layer 1428 are both formed beneath the gate in the gate region of the device (e.g., directly between the gate and the portion of the channel that is modulated by the gate), as well as in the device access regions on either side of the gate region. In order to ensure that 2DEG channel 1419 is induced in the access regions at all times, the barrier layer 1440 can be formed sufficiently thick and with a sufficiently high aluminum concentration. For example, the barrier layer can be thicker than 20 nanometers, for example between 20 and 50 nanometers, and have an aluminum composition greater than 0.2, for example between 0.2 and 0.5. The barrier layer may also optionally be doped n-type. Forming barrier layer 1440 too thick and/or with too high an aluminum composition can cause the 2DEG 1419 to be formed in the gate region when 0V is applied to the gate relative to the drain, which would result in device 1400 being a depletion-mode device.

In order to ensure that 2DEG channel 1419 is not induced in the gate region when 0V or a negative voltage is applied to the gate 1423 relative to the source 1421, p-type layer 1442 is formed beneath gate 1423 to deplete the 2DEG channel 1419 within the gate region. The thickness and p-type doping level in the p-type layer 1442, as well as its composition, is selected to ensure that the 2DEG channel 1419 is depleted in the device gate region when 0V is applied to the gate 1423 relative to the source 1421. For example, the p-type doping level may be greater than $10^{18}$ cm$^{-3}$, greater than $10^{19}$ cm$^{-3}$, or greater than $10^{20}$ cm$^{-3}$, and the thickness may be greater than 1 nm, greater than 5 nm, or greater than 10 nm. Furthermore, as described below, p-type layer 1442 can be a III-Nitride layer which contains aluminum (Al), for example AlGaN, AlInN, or AlInGaN, in order to enable reproducible fabrication of the device 1400.

As described in more detail below, gate 1423 is formed on p-type layer 1442, and p-type layer 1442 is etched away in the device access regions. Etch stop layer 1428 is included to ensure precision in the depth of the etch which removes the p-type layer 1442 in the access regions. In order to effectively function as an etch stop layer, layer 1428 cannot be made too thin. However, having etch stop layer 1428 too thick can degrade the performance of the device. As such, the etch stop layer typically has a thickness of greater than 0.5 nanometers, and is more typically formed to a thickness in the range of 1 nanometer to 5 nanometers or 1 nanometer to 3 nanometers. The same materials, compositions, and thicknesses used for etch stop layer 1228 in device 1200 (FIG. 12F) may also be used for etch stop layer 1428.

Insulator layer 1444 is deposited on the etch stop layer 1428 and can be formed of Si$_x$N$_y$ or the like. The source and drain contacts 1421 and 1422, respectively, electrically contact the conductive channel 1419.

A method of fabricating III-N device 1400 is illustrated in FIGS. 14A-14F. First, as illustrated in FIG. 14A, layers 1412, 1414, 1440, 1428, and 1442 are grown or deposited sequentially on the substrate 1410. In some implementations, layers 1412, 1414, 1440, 1428, and 1442 are all grown by MOCVD. A mask layer 1426, which can for example be Si$_x$N$_y$ deposited by sputtering or PECVD, is deposited on a portion of the p-type layer 1442 in a gate region of the device. Next, as shown in FIG. 14B, a portion of the p-type layer 1442 is dry etched in the access regions of the device, such that the thickness of p-type layer 1442 is less in the access regions than in the gate region.

The device is then annealed in a gas ambient including oxygen at an elevated temperature in order to oxidize the exposed portions of the p-type layer 1442 while the III-N material masked by the mask layer 1426 is not oxidized, as shown in FIG. 14C. As with other devices described herein, the barrier layer 1440 can be formed of a III-N material which includes Al as one of the group-III elements (e.g., AlGaN, AlInN, or AlGaInN), while etch stop layer 1428 can be formed of a III-N material which is substantially free of Al (e.g., GaN or InGaN), such that the oxidation step causes all of the exposed p-type layer 1442 to be oxidized, indicated by 1462, without oxidizing the etch stop layer 1428. In some implementations, after the p-type layer 1442 is etched part way through but prior to the oxidation step, the p-type layer has a thickness in the device access regions that is within the predetermined range that allows for the oxidation to stop precisely on the upper surface of etch stop layer 1428, e.g., in the range of 3 nm to 10 nm. Additionally, in some implementations, barrier layer 1440 is partially oxidized via diffusion through etch stop layer 1428, which can occur in cases where etch stop layer 1428 is made very thin. In still other implementations, the step of partially etching the p-type layer 1442 prior to oxidation (shown in FIG. 14B) is omitted. That is, the p-type layer 1442 may be made sufficiently thin, for example between 3 nm and 10 nm thick, so that the entire thickness of the exposed portions of layer 1442 may be readily oxidized without needing to first be thinned.

Next, as illustrated in FIG. 14D, the oxidized portions 1462 of p-AlGaN layer 1442 are removed, for example using the wet etching process previously described, thereby exposing etch stop layer 1428 in the device access regions. Then, as illustrated in FIG. 14E, mask layer 1426 is removed. Finally, as shown in FIG. 14F, source and drain contacts 1421 and 1422, respectively, are formed on opposite sides of gate region, insulator layer 1444 is formed on the remaining exposed etch stop layer 1428, and the gate electrode 1423 is formed over the p-type layer 1442. In some implementations, insulator layer 1444 can be formed prior to forming source and drain contacts 1421 and 1422, respectively. Although not shown in FIGS. 14D-14F, prior to removing the mask layer 1426, the etch stop layer 1428 may also be removed in the device access regions, such that in the final device, the p-type layer 1442 and etch stop layer 1428 are in the gate region of the device (i.e., beneath the gate) but not in the device access regions on either side of the gate region.

A number of implementations have been described. Nevertheless, it will be understood that various modifications may be made without departing from the spirit and scope of the techniques and devices described herein. For example, the III-N layer structures and gate structures shown for the HEMT devices of FIGS. 11G 12F, 13, and 14 can also be utilized to form a bidirectional switch such as that shown in FIG. 10. Features shown in each of the implementations may be used independently or in combination with one another. Accordingly, other implementations are within the scope of the following claims.

The invention claimed is:
1. A III-N device, comprising:
a III-N material structure comprising a III-N channel layer and a III-N barrier layer;
a source contact and a drain contact electrically coupled to the channel layer;
an insulator layer on the III-N material structure;
a gate insulator at least partially in a first trench, the first trench extending through the insulator layer and into the III-N material structure, a portion of the trench that extends into the III-N material structure having first sidewalls that are substantially more vertical than second sidewalls of the portion of the trench that is through the insulator layer, the gate insulator being on a top surface of the channel layer; and a first gate electrode deposited conformally on top of the gate insulator and at least partially in the first trench, the first gate electrode being positioned between the source and drain contacts;

a second trench between the first gate electrode and the drain contact; and a second gate electrode at least partially in the second trench.

2. The III-N device of claim 1, wherein the first sidewalls of the trench are vertical and the second sidewalls of the trench are slanted.

3. The III-N device of claim 1, wherein the gate electrode includes extending portions that are outside the trench and extend towards but are separated from the source and drain contacts, respectively.

4. The III-N device of claim 1, wherein the barrier layer has a larger bandgap than the channel layer, such that a conductive channel is induced in the channel layer.

5. The III-N device of claim 4, wherein the source and drain contacts form respective ohmic contacts that are electrically coupled to the conductive channel.

6. The III-N device of claim 5, wherein the conductive channel is discontinuous in a region of the channel layer beneath the trench when 0V is applied to the gate electrode relative to the source contact, but is continuous when a voltage greater a threshold voltage of the device is applied to the gate electrode relative to the source contact, the threshold voltage being greater than 0V.

7. The III-N device of claim 6, wherein the III-N device functions as an enhancement-mode field effect transistor, the threshold voltage of the transistor is more than 2 V, and a threshold voltage hysteresis of the transistor is less than 0.5 V.

8. The III-N device of claim 1, wherein the gate insulator is an amorphous film comprising N and at least one of Al and Si.

9. The III-N device of claim 8, wherein a thickness of the amorphous film is between 1 nm and 60 nm.

10. The III-N device of claim 1, wherein the III-N channel layer includes a III-N layer without Aluminum (Al) and the III-N barrier layer includes an Al-based III-N layer.

11. The III-N device of claim 1, wherein the gate insulator is an amorphous film comprising Al and Si.

12. The III-N device of claim 11, wherein a ratio of the silicon fractional composition to the aluminum fractional composition in the amorphous film is less than ⅓.

* * * * *